(12) United States Patent
Ashihara et al.

(10) Patent No.: US 12,283,476 B2
(45) Date of Patent: Apr. 22, 2025

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Hiroshi Ashihara, Toyama (JP); Motomu Degai, Toyama (JP); Takayuki Waseda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 991 days.

(21) Appl. No.: 17/152,327

(22) Filed: Jan. 19, 2021

(65) Prior Publication Data
US 2021/0143001 A1    May 13, 2021

Related U.S. Application Data

(63) Continuation of application No. PCT/JP2018/026673, filed on Jul. 17, 2018.

(51) Int. Cl.
*H01L 21/02* (2006.01)
*C23C 16/34* (2006.01)
(Continued)

(52) U.S. Cl.
CPC ........ *H01L 21/0217* (2013.01); *C23C 16/345* (2013.01); *C23C 16/455* (2013.01);
(Continued)

(58) Field of Classification Search
CPC ........... H01L 21/02211; H01L 21/0228; H01L 21/3105; H01L 21/32; H01L 21/02312;
(Continued)

(56) References Cited

U.S. PATENT DOCUMENTS 5,670,431 A    9/1997 Huanga et al.
2006/0115934 A1    6/2006 Kim et al.
(Continued)

FOREIGN PATENT DOCUMENTS

JP    06-151309 A    5/1994
JP    08-107144 A    4/1996
(Continued)

OTHER PUBLICATIONS

Office Action in corresponding Singapore Patent Application No. 11202100439P, dated Nov. 22, 2021.
(Continued)

*Primary Examiner* — Caleen O Sullivan
(74) *Attorney, Agent, or Firm* — Edell, Shapiro & Finnan, LLC

(57) ABSTRACT

Described herein is a technique capable of selectively forming a thin film on a substrate while suppressing damage to other films of the substrate. According to the technique, there is provided a method of manufacturing a semiconductor device, including: (a) removing a natural oxide film from a surface of a substrate by supplying a first inorganic material to the substrate wherein a first film and a second film different from the first film are exposed on the surface of the substrate; (b) forming an oxide film by oxidizing a surface of the first film by supplying an oxidizing agent to the substrate; (c) modifying the surface of the first film by supplying a second inorganic material to the substrate; and (d) selectively growing a thin film on a surface of the second film by supplying a deposition gas to the substrate, wherein (a) through (d) are sequentially performed.

22 Claims, 17 Drawing Sheets

(51) Int. Cl.
  *C23C 16/455* (2006.01)
  *C23C 16/52* (2006.01)
  *C23C 16/56* (2006.01)
  *H01L 21/311* (2006.01)

(52) U.S. Cl.
  CPC .............. *C23C 16/52* (2013.01); *C23C 16/56* (2013.01); *H01L 21/0206* (2013.01); *H01L 21/02164* (2013.01); *H01L 21/02236* (2013.01); *H01L 21/31111* (2013.01)

(58) Field of Classification Search
  CPC ........... H01L 21/0223; H01L 21/31116; H01L 21/0217; H01L 21/0206; H01L 21/02164; H01L 21/02236; H01L 21/31111; C23C 16/0236; C23C 16/02; C23C 16/54; C23C 16/345; C23C 16/455; C23C 16/52; C23C 16/56; C23C 16/0218; C23C 16/45534; C23C 16/45553
  USPC .......................................................... 438/703
  See application file for complete search history.

(56) References Cited

U.S. PATENT DOCUMENTS

| | | | | |
|---|---|---|---|---|
| 2008/0003161 | A1* | 1/2008 | Kijima | ................. C01G 35/006 423/598 |
| 2015/0147873 | A1 | 5/2015 | Moriya et al. | |
| 2017/0278705 | A1* | 9/2017 | Murakami | ........ C23C 16/45544 |
| 2018/0033608 | A1 | 2/2018 | Miyahara et al. | |
| 2018/0261448 | A1* | 9/2018 | Smith | ................. H01L 21/3105 |

FOREIGN PATENT DOCUMENTS

| | | |
|---|---|---|
| JP | 2003-100746 A | 4/2003 |
| JP | 2008-522437 A | 6/2008 |
| JP | 2010-171101 A | 8/2010 |
| JP | 2015-122481 A | 7/2015 |
| JP | 2017-222928 A | 12/2017 |
| JP | 2018-22716 A | 2/2018 |
| KR | 10-2018-0014661 A | 2/2018 |

OTHER PUBLICATIONS

Office Action in corresponding Japanese Patent Application No. 2020-530752, dated Aug. 25, 2021, with English translation.
Notice of First Examonation Report with English translation in Chinese Application No. 201880095706.7, dated Juty 27, 2023, 18 pages.
Request for the Submission of an Opinion with English translation in Korean Application No. 10-2021-7001338, issued Jan. 18, 2023, 11 pages.

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application is a continuation of International Application No. PCT/JP2018/026673, filed on Jul. 17, 2018, the entire contents of which are hereby incorporated by reference.

TECHNICAL FIELD

The present disclosure relates to a method of manufacturing a semiconductor device, a substrate processing apparatus and a non-transitory computer-readable recording medium.

BACKGROUND

As a large scale integrated circuit (hereinafter, also referred to as "LSI circuit") is miniaturized, a patterning technique is also improving in response thereto. As the patterning technique, for example, a hard mask and the like may be used. Due to the miniaturization of the LSI circuit, it may be difficult to separate an etching region and a non-etching region from each other by exposing a photoresist using the hard mask. Therefore, an epitaxial film such as a silicon (Si) film and a silicon germanium (SiGe) film may be selectively grown and formed on a substrate such as a silicon wafer.

As the LSI circuit is miniaturized, a method of controlling a function of a transistor device may be more complicated. A transistor of a type in which the voltage is applied to an electrode referred to as a gate to control the current of a conductive portion referred to as a channel by an electric field may be referred to as a field effect transistor (hereinafter, also referred to as a "FET"). As a method of forming a fin in the FET, processing of the conductive portion such as a silicon nitride film (SiN film) is widely used.

It is desirable to form the fin with a high processing accuracy, and it is also desirable to process the fin as vertically as possible by a dry etching process from the viewpoint of securing a wide path through which the current flows. However, when the SiN film is used as a hard mask, the SiN film is slightly etched not only on an upper surface thereof but also on a side surface thereof. Thus, the SiN film may not function as an ideal mask. As a result, it is difficult to obtain an ideally vertical shape of processed silicon. In addition, a ratio of the height to the width of the fin, that is, an aspect ratio tends to increase. Thus, a width of the SiN film may be insufficient so that it may become difficult to process the fin to a predetermined depth.

SUMMARY

Described herein is a technique capable of selectively forming a thin film on a substrate while suppressing damage to other films of the substrate on which the thin film is not formed.

According to one aspect of the technique of the present disclosure, there is provided a method of manufacturing a semiconductor device, including: (a) removing a natural oxide film from a surface of a substrate by supplying a first inorganic material to the substrate wherein at least a first film and a second film different from the first film are exposed on the surface of the substrate; (b) forming an oxide film by oxidizing a surface of the first film by supplying an oxidizing agent to the substrate; (c) modifying the surface of the first film by supplying a second inorganic material to the substrate; and (d) selectively growing a thin film on a surface of the second film by supplying a deposition gas to the substrate, wherein (a) through (d) are sequentially performed.

DETAILED DESCRIPTION

Subsequently, a preferred embodiment of the present disclosure will be described. Hereinafter, the preferred embodiment of the present disclosure will be described with reference to the drawings.

(1) Configuration of Substrate Processing Apparatus

Figure 1:
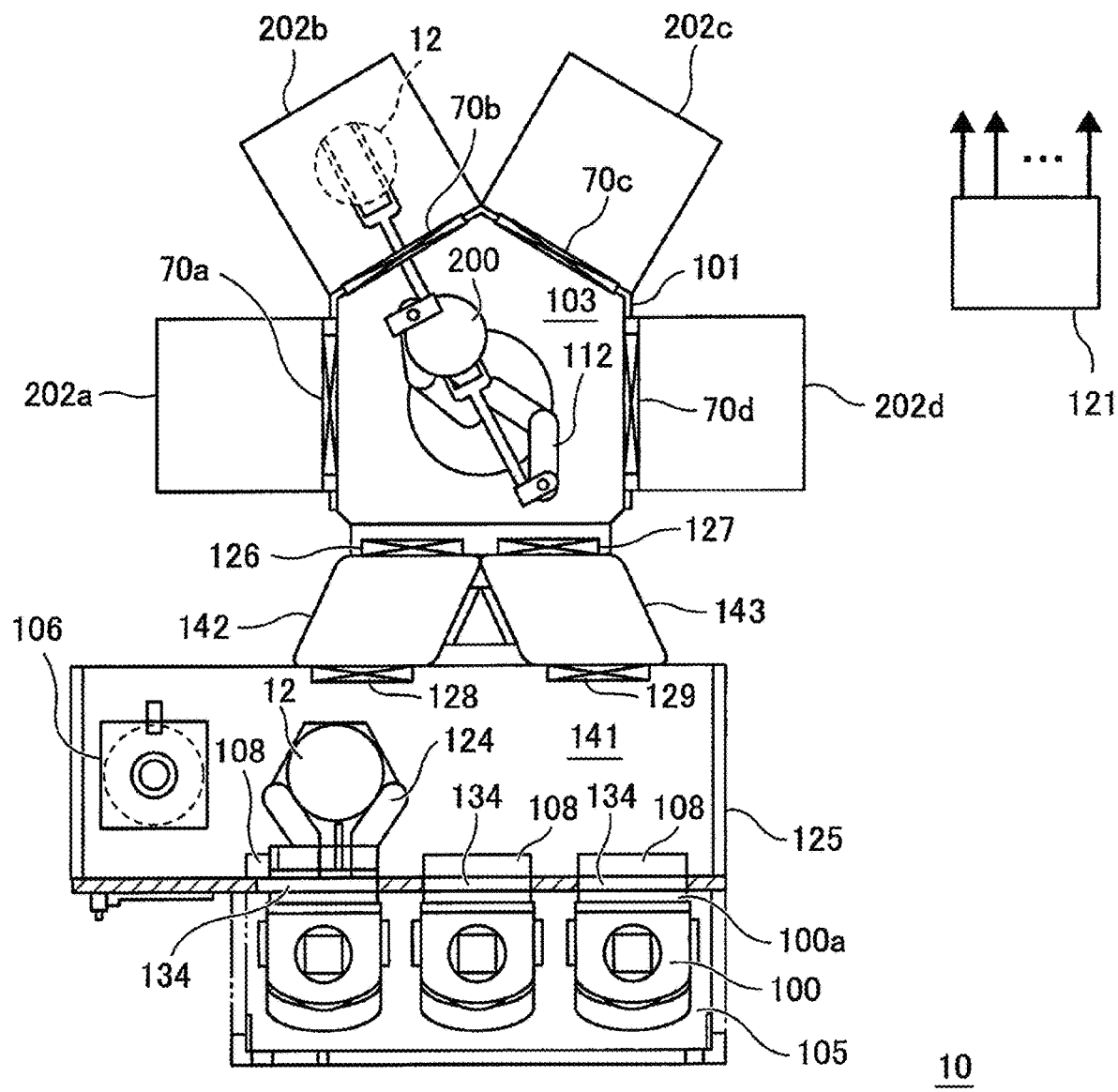
FIG. 1 is a top sectional view schematically illustrating a substrate processing apparatus 10 according to an embodiment of the present disclosure.

FIG. 1 is a top sectional view schematically illustrating a substrate processing apparatus of performing a method of manufacturing a semiconductor device. Hereinafter, the substrate processing apparatus of performing the method of manufacturing the semiconductor device is simply referred to as a "substrate processing apparatus 10". A transfer device of the substrate processing apparatus 10 of a cluster type according to the present embodiment is divided into a vacuum side and an atmospheric side. In addition, in the substrate processing apparatus 10, a FOUP (Front Opening Unified Pod, hereinafter, also referred to as a "pod") 100 is used as a carrier for transferring a wafer 200 serving as a substrate.

Configuration of Vacuum Side

As shown in FIG. 1, the substrate processing apparatus 10 includes a first transfer chamber 103 capable of withstanding a pressure (negative pressure) below the atmospheric pressure such as a pressure in a vacuum state. For example, a housing 101 of the first transfer chamber 103 is pentagonal when viewed from above. The housing 101 is of a box shape with closed upper and lower ends.

In the first transfer chamber 103, a first substrate transfer device 112 configured to transfer the wafer 200 is installed. The first substrate transfer device 112 is used as a transfer system to transfer the wafer 200 into or out of each of process furnaces 202a, 202b, 202c and 202d described later.

A spare chamber (which is a loadlock chamber) 142 and a spare chamber (which is a loadlock chamber) 143 are connected to a sidewall among five sidewalls of the housing 101 that is located on a front side of the housing 101 via a gate valve 126 and a gate valve 127, respectively. The spare chambers 142 and 143 are capable of withstanding the negative pressure. The wafer 200 can be loaded into or unloaded out of the spare chambers 142 and 143.

The process furnace 202a serving as a first processing structure, the process furnace 202b serving as a second processing structure, the process furnace 202c serving as a third processing structure and the process furnace 202d serving as a fourth processing structure, which are configured to accommodate the substrate (that is, the wafer 200) and to perform a predetermined processing on the substrate, are connected adjacently to the four sidewalls (among the five sidewalls) of the housing 101 that are located on a rear side of the housing 101 of the first transfer chamber 103 with a gate valve 70a, a gate valve 70b, a gate valve 70c and a gate valve 70d interposed therebetween, respectively.

Configuration of Atmospheric Side

A second transfer chamber 141 wherein the wafer 200 can be transferred under the atmospheric pressure is connected to the front sides of the spare chamber 142 and the spare chamber 143 via a gate valve 128 and a gate valve 129. In the second transfer chamber 141, a second substrate transfer device 124 configured to transfer the wafer 200 is installed.

A notch aligner 106 is installed on a left side of the second transfer chamber 141. The notch aligner 106 may be an orientation flat aligner. In addition, a clean air supply structure configured to supply clean air is installed above the second transfer chamber 141.

A substrate loading/unloading port 134 and a pod opener 108 are installed at a front side of a housing 125 of the second transfer chamber 141 to load the wafer 200 into or unload the wafer 200 out of the second transfer chamber 141. A loading port (which is an I/O stage) 105 is installed at one side of the substrate loading/unloading port 134 opposite to the pod opener 108. That is, the loading port 105 is installed outside the housing 125. The pod opener 108 is configured to open or close a cap 100a of the pod 100. The pod opener 108 includes a closure capable of opening and closing the substrate loading/unloading port 134. When the cap 100a of the pod 100 placed on the loading port 105 is opened, the wafer 200 may be loaded into the pod 100 or unloaded out of the pod 100. The pod 100 is loaded onto or unloaded out of the loading port 105 by an in-step transfer device (not shown) such as an OHT (Overhead Hoist Transfer).

Configuration of Process Furnace 202a

Figure 2:
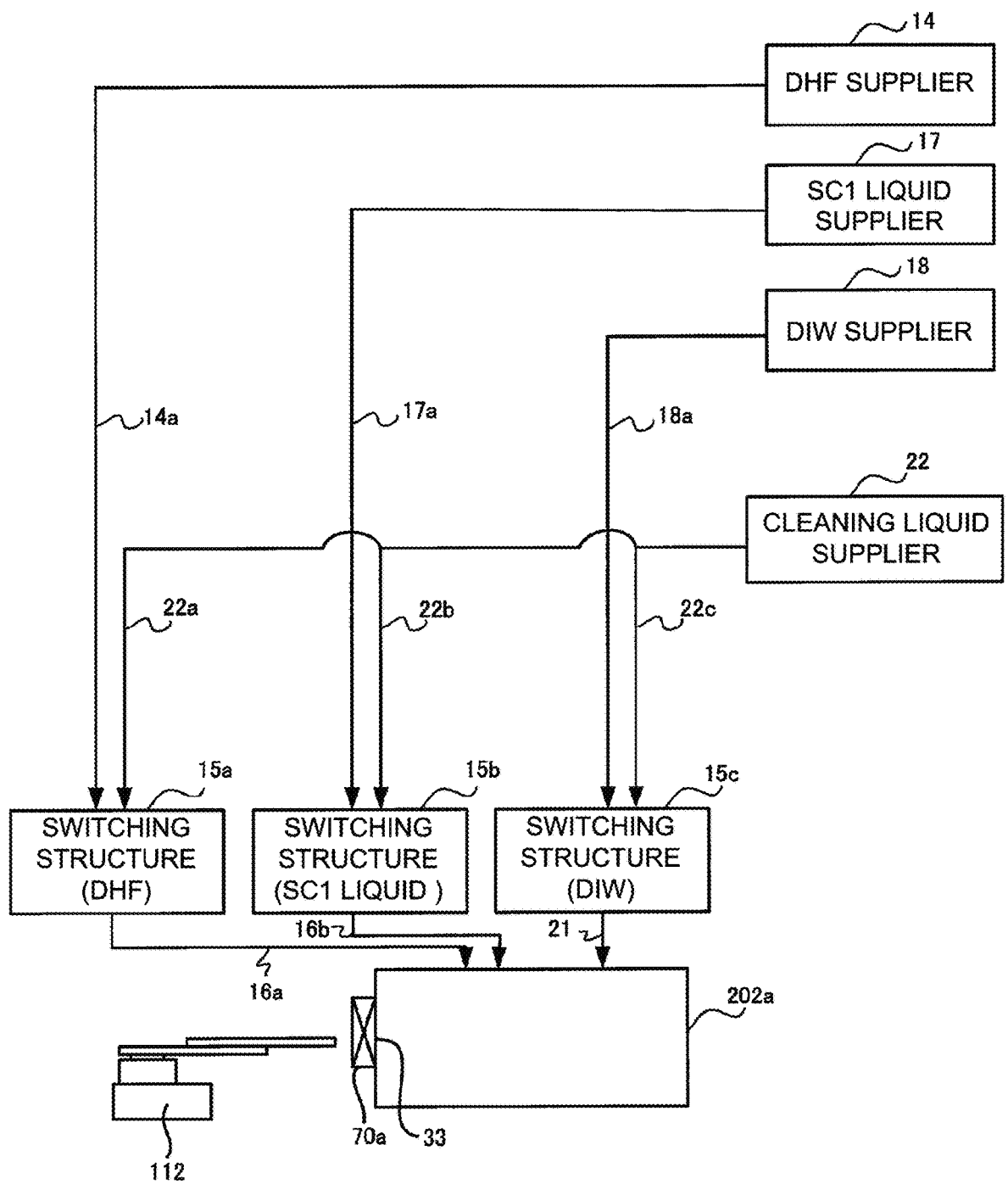
FIG. 2 is a diagram for explaining a configuration of a process furnace 202a of the substrate processing apparatus 10 according to the embodiment of the present disclosure.
Figure 3:
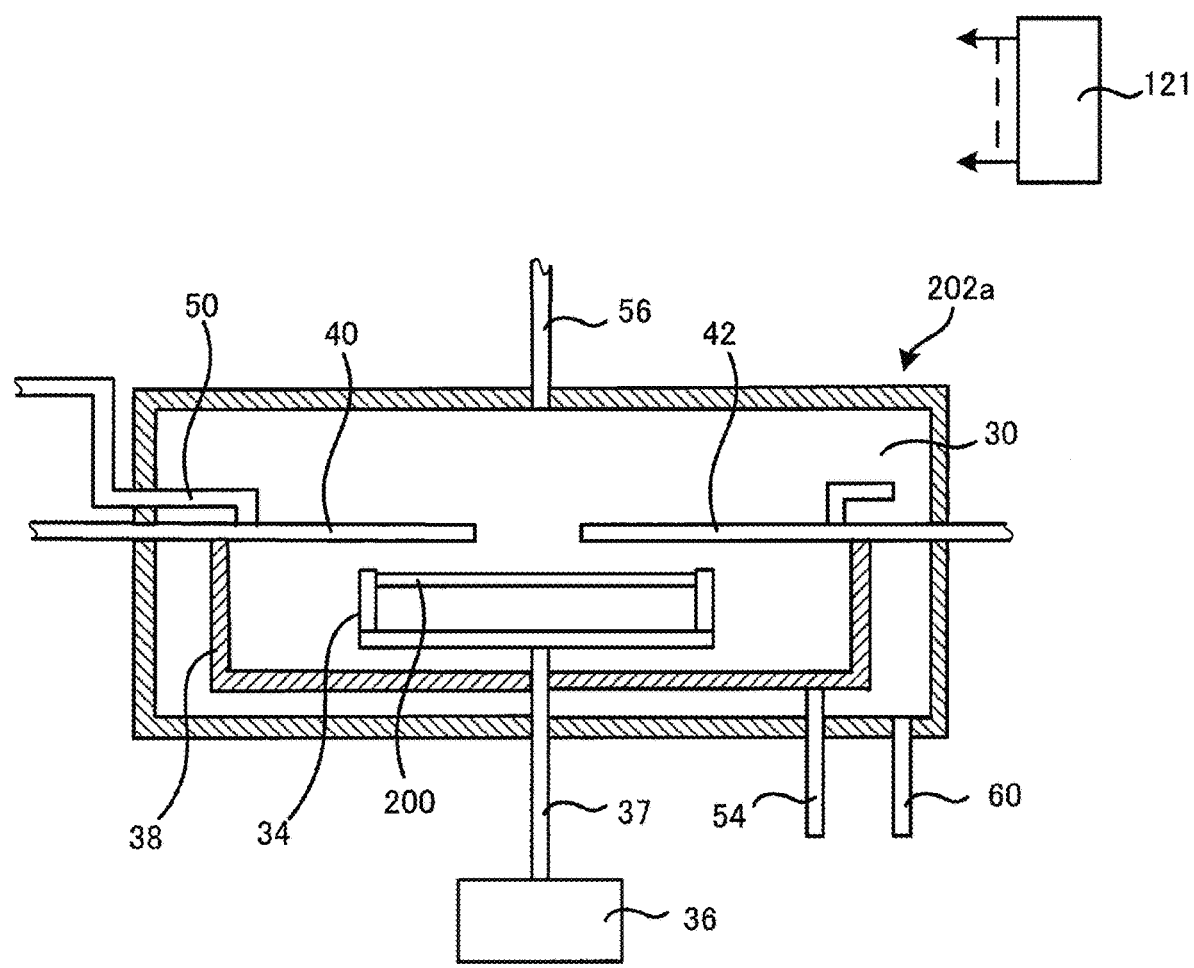
FIG. 3 schematically illustrates a vertical cross-section of the process furnace 202a shown in FIG. 2.

FIG. 2 schematically illustrates a configuration of the process furnace 202a serving as a first processing structure included in the substrate processing apparatus 10, and FIG. 3 schematically illustrates a vertical cross-section of the process furnace 202a.

According to the present embodiment, the process furnace 202a is used as a cleaning structure (which is a substrate cleaning apparatus) configured to remove a natural oxide film and to form an oxide film on the surface of a silicon (Si) layer.

The process furnace 202a is a single wafer type process furnace configured to process one or several wafers at a time. A DHF supplier (which is a DHF supply structure) 14, an SC1 liquid supplier (which is a SC1 liquid supply structure) 17, a DIW supplier (which is a DIW supply structure) 18 and a cleaning liquid supplier (which is a cleaning liquid supply structure) 22 are connected to the process furnace 202a.

The DHF supplier 14 is configured to supply a chemical solution such as dilute hydrofluoric acid (DHF), which is a first halogen-based material (halide) containing a halogen element as a first inorganic material, into the process furnace 202a.

The SC1 liquid supplier 17 is configured to supply a chemical solution such as a mixed solution of ammonia ($NH_3$) and hydrogen peroxide solution ($H_2O_2$) (hereinafter, simply referred to as a "SC1 liquid"), which is an oxidizing agent, into the process furnace 202a.

The DIW supplier 18 is configured to supply a rinse liquid such as deionized water (DIW) into the process furnace 202a.

The cleaning liquid supplier 22 is configured to supply a cleaning liquid, which is a pipe cleaning liquid, into the process furnace 202a. For example, an oxidizing liquid obtained by mixing one or more of hydrogen peroxide solution, ozone water, hypochlorous acid, nitrate, chloramine and dimethyl sulfoxide, or an organic solvent obtained by mixing one or more of methanol, ethanol, isopropyl alcohol, n-propyl alcohol, ethylene glycol and 2-methyl-2-propanol may be used as the cleaning liquid.

The DHF supplier 14 is connected to the process furnace 202a via a pipe 14a, a switching structure 15a and a pipe 16a. The SC1 liquid supplier 17 is connected to the process furnace 202a via a pipe 17a, a switching structure 15b and a pipe 16b. The DIW supplier 18 is connected to the process furnace 202a via a pipe 18a, a switching structure 15c and a pipe 21. The cleaning liquid supplier 22 is connected to the switching structure 15a, the switching structure 15b and the switching structure 15c via pipes 22a, 22b and 22c, respectively.

Therefore, the DHF supplier 14 supplies the DHF into the process furnace 202a via the pipe 14a, the switching structure 15a and the pipe 16a. When the switching structure 15a is switched to the cleaning liquid supplier 22 to supply the cleaning liquid, the supply of the DHF into the process furnace 202a is stopped, and the cleaning liquid provided in the cleaning liquid supplier 22 is supplied into the process furnace 202a via the pipe 22a, the switching structure 15a and the pipe 16a.

Further, the SC1 liquid supplier 17 supplies the SC1 liquid into the process furnace 202a via the pipe 17a, the switching structure 15b and the pipe 16b. When the switching structure 15b is switched to the cleaning liquid supplier 22 to supply the cleaning liquid, the supply of the SC1 liquid into the process furnace 202a is stopped, and the cleaning liquid provided in the cleaning liquid supplier 22 is supplied into the process furnace 202a via the pipe 22b, the switching structure 15b and the pipe 16b.

Further, the DIW supplier 18 supplies the DIW into the process furnace 202a via the pipe 18a, the switching structure 15c and the pipe 21. When the switching structure 15c is switched to the cleaning liquid supplier 22 to supply the cleaning liquid, the supply of the DIW into the process furnace 202a is stopped, and the cleaning liquid provided in the cleaning liquid supplier 22 is supplied into the process furnace 202a via the pipe 22c, the switching structure 15c and the pipe 21.

FIG. 3 schematically illustrates the vertical cross-section of the process furnace 202a for explaining the configuration of the process furnace 202a. A cleaning chamber 30 serving as a first process chamber is provided in the process furnace 202a. The cleaning chamber 30 is provided with a support 34 that horizontally supports the wafer 200. The support 34 is connected to a rotator 36 constituted by components such as a motor via a rotating shaft 37. The rotator 36 is configured to rotate the wafer 200 while the wafer 200 is horizontally supported by the support 34.

The periphery of the support 34 is surrounded by a cover 38. As will be described later, the cover 38 is configured to receive the chemical solution scattering from the wafer 200 when the wafer 200 is rotated by the support 34 and the rotator 36.

A substrate loading/unloading port 33 (shown in FIG. 2) is provided on a side surface of the process furnace 202a. The gate valve 70a (shown in FIGS. 1 and 2) is installed at the substrate loading/unloading port 33, and the substrate loading/unloading port 33 is opened and closed by the gate valve 70a. In addition, the first substrate transfer device 112 is configured to transfer the wafer 200 to the support 34 via the substrate loading/unloading port 33.

A nozzle 40 and a nozzle 42 are inserted into the cleaning chamber 30 described above. The pipe 16a configured to supply the DHF and the pipe 16b configured to supply the SC1 liquid are connected to the nozzle 40 in the cleaning chamber 30. In addition, the pipe 21 configured to supply the DIW into the cleaning chamber 30 is connected to the nozzle 42. The nozzle 40 and the nozzle 42 are arranged substantially horizontally so that front ends (tips) thereof extend to a front portion near a center of the wafer 200 supported by the support 34. Therefore, the DHF and the SC1 liquid are supplied through the nozzle 40 to the center of the wafer 200 via the pipes 16a and 16b, respectively. The DIW is supplied through the nozzle 42 to the center of the wafer 200 via the pipe 21. In addition, by switching the switching structure 15a, the switching structure 15b or the switching structure 15c to the cleaning liquid supplier 22 to supply the cleaning liquid, the cleaning liquid is supplied into the pipe 16a, the pipe 16b or the pipe 21, and the cleaning liquid is supplied into the cleaning chamber 30 through the nozzle 40, the nozzle 42 or both of the nozzle 40 and the nozzle 42.

A water supplier (which is a water supply structure) 50 is opened around an inner upper portion of the cover 38 described above so that pure water (deionized water) can be supplied to an inner surface of the cover 38.

A drain pipe 54 configured to discharge the pure water supplied to the cover 38 is connected to a lower surface of the cover 38, and the drain pipe 54 extends to the outside of the process furnace 202a. The pure water in the cover 38 is discharged through the drain pipe 54. The chemical solution and the rinse liquid supplied to the wafer 200 are also discharged through the drain pipe 54.

A drying gas supply pipe 56 is connected to an upper portion of the process furnace 202a. As a drying gas supplied through the drying gas supply pipe 56, for example, nitrogen ($N_2$) may be used. In addition, an exhaust pipe 60 configured to discharge the drying gas is connected to a lower portion of the process furnace 202a.

A first gas supply system configured to supply the DHF serving as the first inorganic material is constituted mainly by the DHF supplier 14, the pipe 14a, the switching structure 15a, the pipe 16a and the nozzle 40. A second gas supply system configured to supply the oxidizing agent is constituted mainly by the SC1 liquid supplier 17, the pipe 17a, the switching structure 15b, the pipe 16b and the nozzle 40. A DIW supply system configured to supply the DIW is constituted mainly by the DIW supplier 18, the pipe 18a, the switching structure 15c, the pipe 21 and the nozzle 42. The DIW supply system may be included in the first gas supply system or the second gas supply system. In addition, a cleaning liquid supply system configured to supply the cleaning liquid is constituted mainly by the cleaning liquid supplier 22, the pipes 22a through 22c, the switching structures 15a through 15c, the pipes 16a, 16b and 21 and the nozzles 40 and 42.

Configuration of Process Furnace 202b

Figure 4:
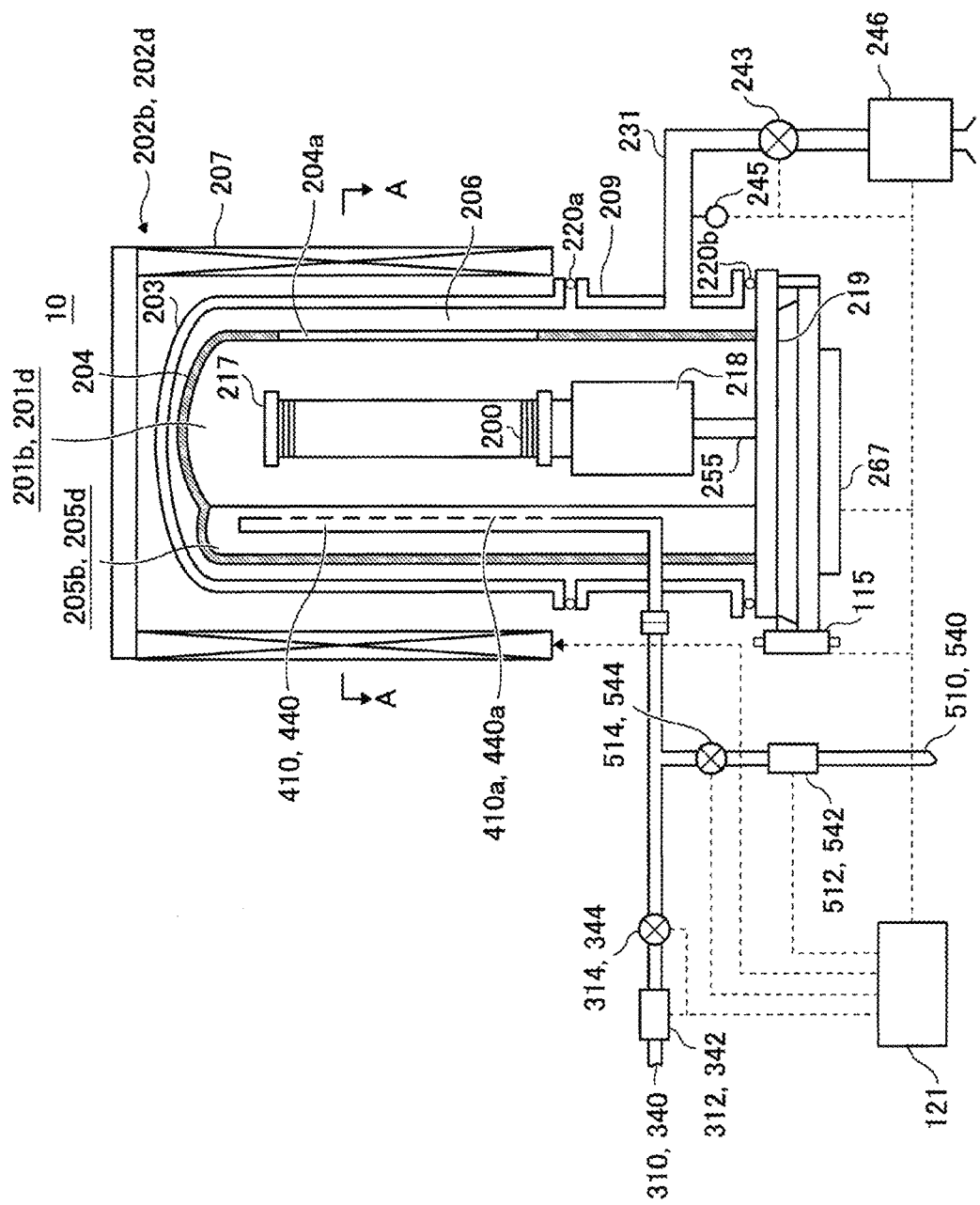
FIG. 4 schematically illustrates a vertical cross-section of a process furnace 202b or 202d of the substrate processing apparatus 10 according to the embodiment of the present disclosure.
Figure 5:
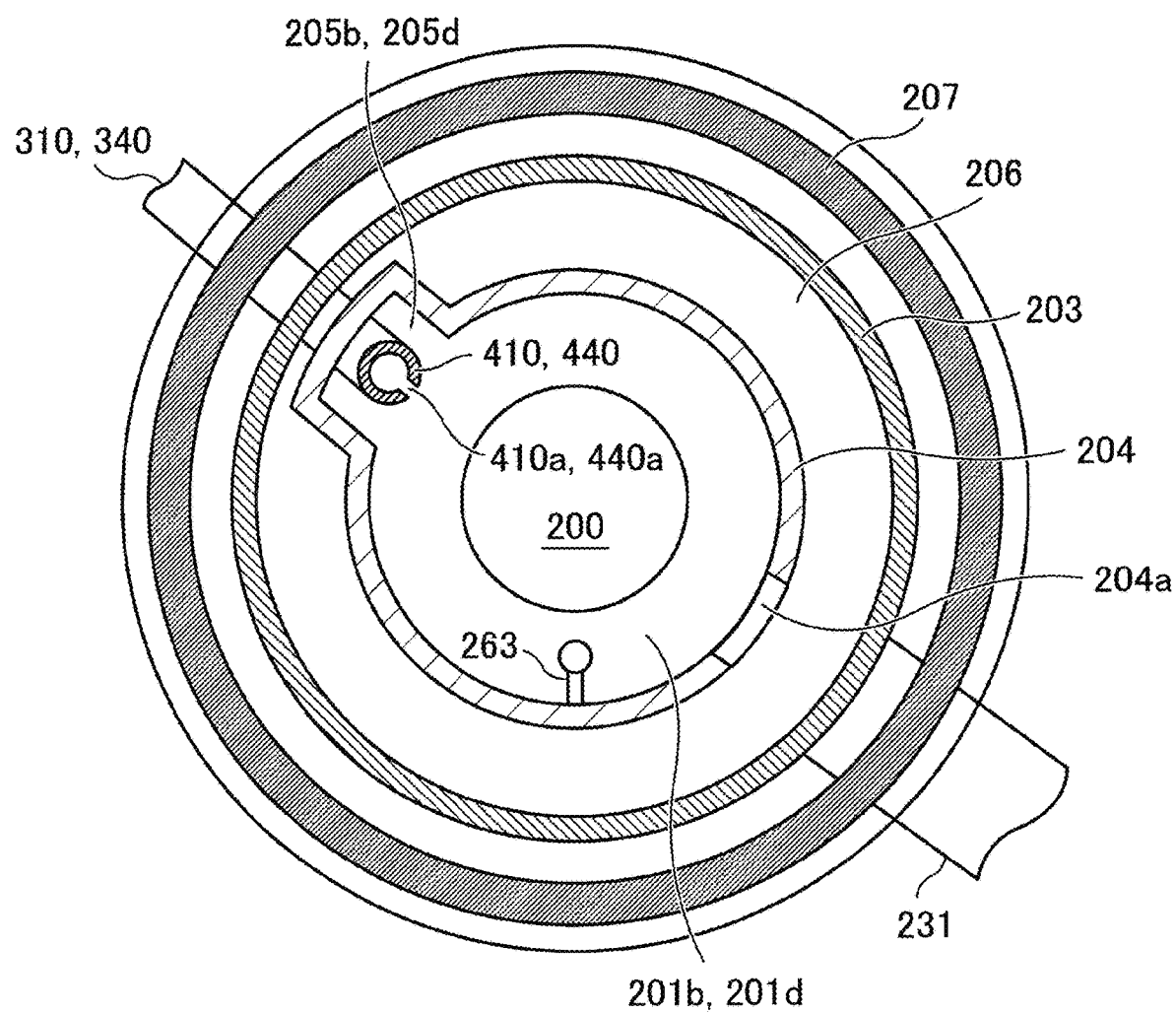
FIG. 5 is a top sectional view schematically illustrating the process furnace 202b or 202d shown in FIG. 4.

FIG. 4 schematically illustrates a configuration of the process furnace 202b serving as a second processing structure included in the substrate processing apparatus 10, and FIG. 5 schematically illustrates a vertical cross-section of the process furnace 202b.

According to the present embodiment, the process furnace 202b is used as a modifying structure (pre-processing structure) (which is a substrate modifying apparatus) configured to perform a modifying process (which is a pre-processing) before a film-forming process is performed. A batch type process furnace configured to process a plurality of wafers at a time is used as the process furnace 202b.

The process furnace 202b includes a heater 207 serving as a heating structure (which is a heating device or a heating system). The heater 207 is of a cylindrical shape, and is vertically installed while being supported by a heater base (not shown) serving as a support plate.

An outer tube 203 constituting a reaction vessel (process vessel) is provided in an inner side of the heater 207 to be aligned in a manner concentric with the heater 207. For example, the outer tube 203 is made of a heat resistant material such as quartz ($SiO_2$) and silicon carbide (SiC). The outer tube 203 is of a cylindrical shape with a closed upper end and an open lower end. A manifold (which is an inlet flange) 209 is provided under the outer tube 203 to be aligned in a manner concentric with the outer tube 203. The manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the reaction vessel (process vessel) is provided in an inner side of the outer tube 203. For example, the inner tube 204 is made of a heat resistant material such as quartz ($SiO_2$) and silicon carbide (SiC). The inner tube 204 is of a cylindrical shape with a closed upper end and an open lower end. The process vessel (reaction vessel) is constituted mainly by the outer tube 203, the inner tube 204 and the manifold 209. A process chamber 201b serving as a second process chamber is provided in a hollow cylindrical portion of the process vessel (that is, an inside of the inner tube 204).

The process chamber 201b is configured to accommodate a plurality of wafers including the wafer 200 serving as a substrate vertically in a horizontal orientation in a multistage manner by a boat 217 described later.

A nozzle 410 is installed in the process chamber 201b so as to penetrate side walls of the manifold 209 and the inner tube 204. A gas supply pipe 310 is connected to the nozzle 410. However, the process furnace 202b of the present embodiment is not limited to the example described above.

A mass flow controller (MFC) 312 serving as a flow rate controller (flow rate control device) and a valve 314 serving as an opening/closing valve are sequentially installed at the gas supply pipe 310 from an upstream side to a downstream side of the gas supply pipe 310. A gas supply pipe 510 configured to supply an inert gas is connected to the gas supply pipe 310 at a downstream side of the valve 314. An MFC 512 and a valve 514 are sequentially installed at the gas supply pipe 510 from an upstream side to a downstream side of the gas supply pipe 510.

The nozzle 410 is connected to a front end (tip) of the gas supply pipe 310. The nozzle 410 may include an L-shaped nozzle. A horizontal portion of the nozzle 410 is installed so as to penetrate the side walls of the manifold 209 and the inner tube 204. A vertical portion of the nozzle 410 protrudes outward in a radial direction of the inner tube 204 and is installed in a spare chamber 205b of a channel shape (a groove shape) extending in the vertical direction. That is, the vertical portion of the nozzle 410 is installed in the spare chamber 205b toward the upper end of the inner tube 204 (in a direction in which the plurality of the wafers including the wafer 200 are arranged) and along an inner wall of the inner tube 204.

The nozzle 410 extends from a lower region of the process chamber 201b to an upper region of the process chamber 201b. The nozzle 410 is provided with a plurality of gas supply holes 410a facing the plurality of the wafers including the wafer 200. Thereby, a process gas can be supplied to the plurality of the wafers through the plurality of the gas supply holes 410a. The plurality of the gas supply holes 410a are provided from a lower portion to an upper portion of the inner tube 204. An opening area of each the gas supply holes 410a is the same, and each of the gas supply holes 410a is provided at the same pitch. However, the plurality of the gas supply holes 410a are not limited thereto. For example, the opening area of each of the gas supply holes 410a may gradually increase from the lower portion to the upper portion of the inner tube 204 to further uniformize a flow rate of the gas supplied through the plurality of the gas supply holes 410a.

The plurality of the gas supply holes 410a of the nozzle 410 are provided from a lower portion to an upper portion of the boat 217 described later. Therefore, the process gas supplied into the process chamber 201b through the plurality of the gas supply holes 410a of the nozzle 410 is supplied onto the plurality of the wafers including the wafer 200 accommodated in the boat 217 from the lower portion to the upper portion thereof, that is, the entirety of the plurality of the wafers accommodated in the boat 217. It is preferable that the nozzle 410 extends from the lower region to the upper region of the process chamber 201b. However, the nozzle 410 may extend only to the vicinity of a ceiling of the boat 217.

A modifying gas such as a second halogen-based material (halide) serving as a second inorganic material is supplied into the process chamber 201b through the gas supply pipe 310 provided with the MFC 312 and the valve 314 and the nozzle 410. As the modifying gas, for example, a fluorine (F)-containing gas containing an electrically negative ligand may be used. For example, chlorine trifluoride ($ClF_3$) gas may be used as the fluorine-containing gas. The modifying gas is used as an adsorption control agent capable of controlling the adsorption of a deposition gas described later.

An inert gas such as nitrogen (N$_2$) gas is supplied into the process chamber 201b through the gas supply pipe 510 provided with the MFC 512 and the valve 514 and the nozzle 410. While the present embodiment will be described by way of an example in which the N$_2$ gas is used as the inert gas, the inert gas according to the present embodiment is not limited thereto. For example, instead of the N$_2$ gas, a rare gas such as argon (Ar) gas, helium (He) gas, neon (Ne) gas and xenon (Xe) gas may be used as the inert gas.

A third gas supply system (modifying gas supply system) configured to supply the modifying gas serving as the second halogen-based material is constituted mainly by the gas supply pipe 310, the MFC 312, the valve 314 and the nozzle 410. However, only the nozzle 410 may be considered as the third gas supply system. An inert gas supply system is constituted mainly by the gas supply pipe 510, the MFC 512 and the valve 514. The third gas supply system may further include the inert gas supply system.

According to the present embodiment, the gas is supplied into a vertically long annular space which is defined by the inner wall of the inner tube 204 and the edges (peripheries) of the plurality of the wafers including the wafer 200 through the nozzle 410 provided in the spare chamber 205b. The gas is ejected into the inner tube 204 through the plurality of the gas supply holes 410a of the nozzle 410 facing the plurality of the wafers. Specifically, the gas such as the modifying gas is ejected into the inner tube 204 in a direction parallel to the surfaces of the plurality of the wafers through the plurality of the gas supply holes 410a of the nozzle 410.

An exhaust hole (exhaust port) 204a facing the nozzle 410 is provided at the sidewall of the inner tube 204. For example, the exhaust hole 204a may be of a narrow slit shape elongating vertically. The gas supplied into the process chamber 201b through the plurality of the gas supply holes 410a of the nozzle 410 flows over the surfaces of the plurality of the wafers including the wafer 200. The gas that has flowed over the surfaces of the plurality of the wafers is exhausted through the exhaust hole 204a into an exhaust path 206 which is a gap provided between the inner tube 204 and the outer tube 203. The gas flowing in the exhaust path 206 flows into an exhaust pipe 231 and is then discharged out of the process furnace 202b.

The exhaust hole 204a is provided to face the plurality of the wafers including the wafer 200. The gas supplied in the vicinity of the plurality of the wafers in the process chamber 201b through the plurality of the gas supply holes 410a flows in the horizontal direction. The gas that has flowed in the horizontal direction is exhausted through the exhaust hole 204a into the exhaust path 206. The exhaust hole 204a is not limited to a slit-shaped through-hole. For example, the exhaust hole 204a may be configured as a plurality of holes.

The exhaust pipe 231 configured to exhaust an inner atmosphere of the process chamber 201b is installed at the manifold 209. A pressure sensor 245 serving as a pressure detector (pressure detecting structure) configured to detect an inner pressure of the process chamber 201b, an APC (Automatic Pressure Controller) valve 243 and a vacuum pump 246 serving as a vacuum exhaust apparatus are sequentially installed at the exhaust pipe 231 from an upstream side to a downstream side of the exhaust pipe 231. With the vacuum pump 246 in operation, the APC valve 243 may be opened or closed to vacuum-exhaust the process chamber 201b or stop the vacuum exhaust. With the vacuum pump 246 in operation, an opening degree of the APC valve 243 may be adjusted in order to adjust the inner pressure of the process chamber 201b. An exhaust system is constituted mainly by the exhaust hole 204a, the exhaust path 206, the exhaust pipe 231, the APC valve 243 and the pressure sensor 245. The exhaust system may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS, and is of a disk shape. An O-ring 220b serving as a seal is provided on an upper surface of the seal cap 219 so as to be in contact with the lower end of the manifold 209. A rotator 267 configured to rotate the boat 217 accommodating the plurality of the wafers including the wafer 200 is provided at the seal cap 219 opposite to the process chamber 201b. A rotating shaft 255 of the rotator 267 is connected to the boat 217 through the seal cap 219. As the rotator 267 rotates the boat 217, the plurality of the wafers are rotated. The seal cap 219 may be elevated or lowered in the vertical direction by a boat elevator 115 serving as an elevator provided outside the outer tube 203 vertically.

When the seal cap 219 is elevated or lowered in the vertical direction by the boat elevator 115, the boat 217 may be transferred (loaded) into the process chamber 201b or transferred (unloaded) out of the process chamber 201b. The boat elevator 115 serves as a transfer device (transfer structure) that loads the boat 217 and the plurality of the wafers including the wafer 200 accommodated in the boat 217 into the process chamber 201b or unloads the boat 217 and the plurality of the wafers including the wafer 200 accommodated in the boat 217 out of the process chamber 201b.

The boat 217 serving as a substrate retainer is configured to accommodate (support) the plurality of the wafers including the wafer 200 (for example, 25 to 200 wafers) while the plurality of the wafers are horizontally oriented with their centers aligned with each other with predetermined intervals therebetween in a multistage manner. For example, the boat 217 is made of a heat resistant material such as quartz and SiC. An insulating plate 218 horizontally oriented is provided under the boat 217 in a multistage manner (not shown). The insulating plate 218 is made of a heat resistant material such as quartz and SiC. The insulating plate 218 suppresses the transmission of the heat from the heater 207 to the seal cap 219. However, the present embodiment is not limited thereto. For example, instead of the insulating plate 218, a heat insulating cylinder (not shown) such as a cylinder made of a heat resistant material such as quartz and SiC may be provided under the boat 217.

As shown in FIG. 5, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201b can be obtained. Similar to the nozzle 410, the temperature sensor 263 is L-shaped, and is provided along the inner wall of the inner tube 204.

Configuration of Process Furnace 202c

Figure 6:
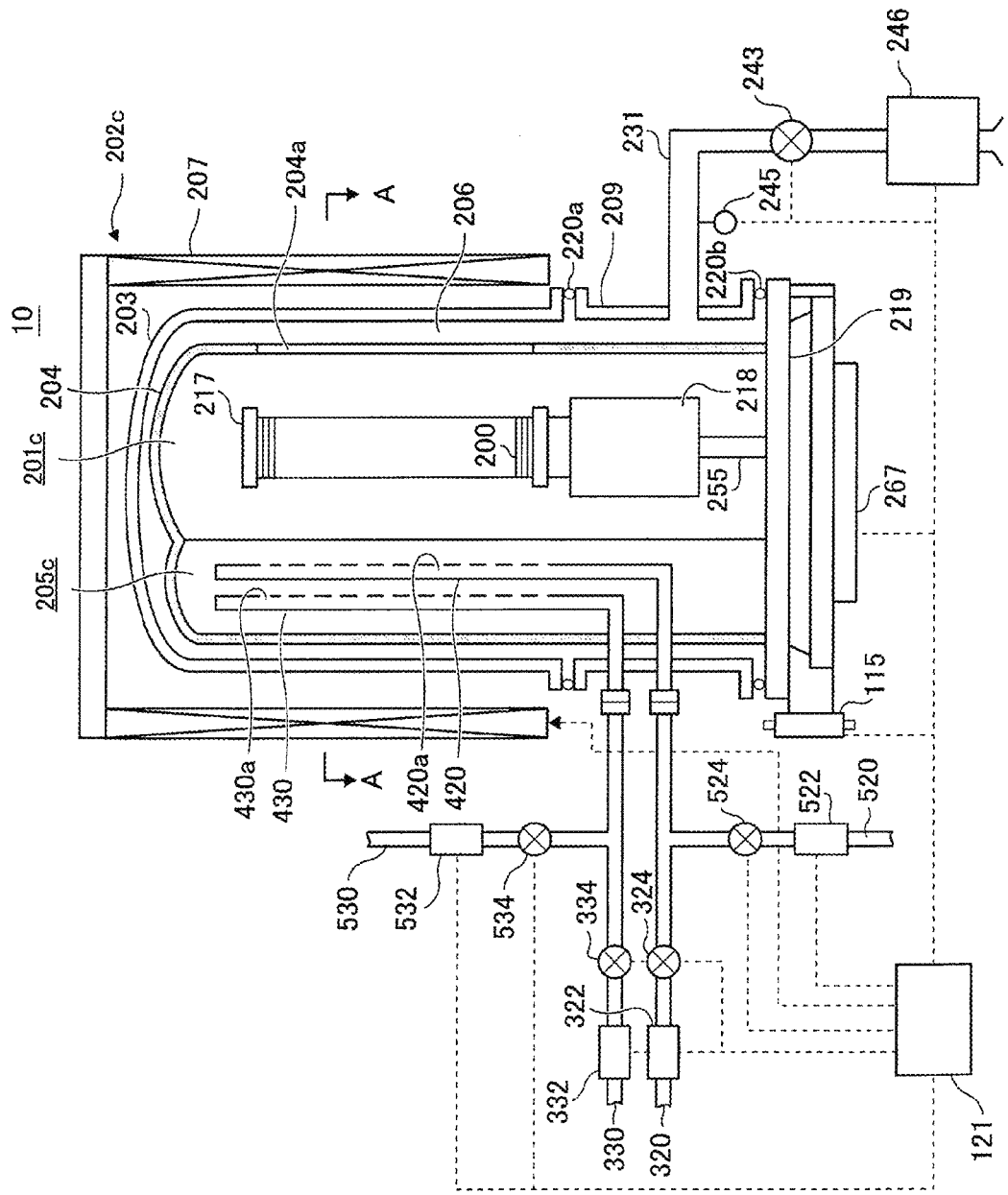
FIG. 6 schematically illustrates a vertical cross-section of a process furnace 202c of the substrate processing apparatus 10 according to the embodiment of the present disclosure.
Figure 7:
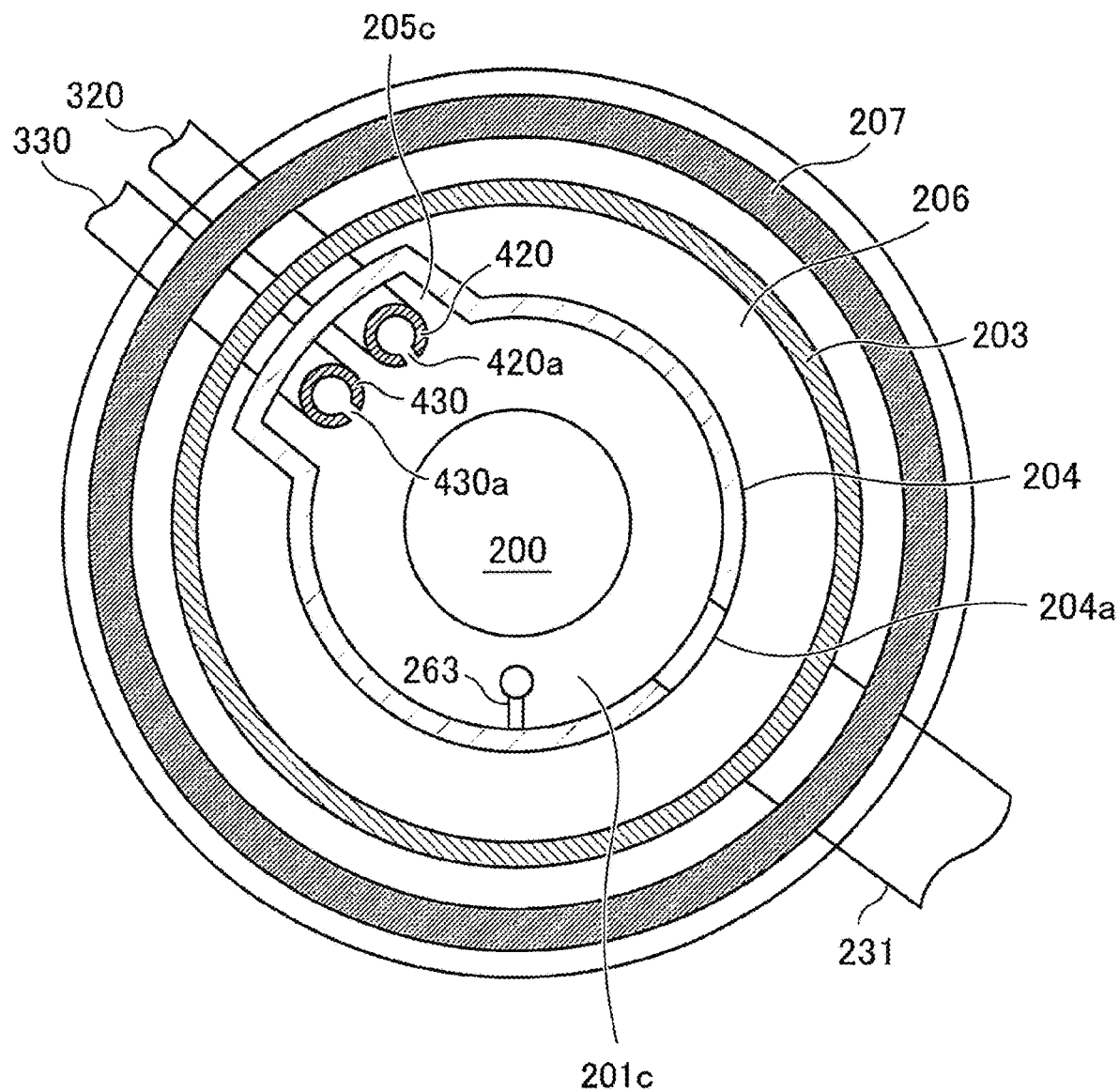
FIG. 7 is a top sectional view schematically illustrating the process furnace 202c shown in FIG. 6.

FIG. 6 schematically illustrates a vertical cross-section of the process furnace 202c serving as a third processing structure included in the substrate processing apparatus 10, and FIG. 7 is a top sectional view schematically illustrating the process furnace 202c. A process chamber 201c serving as a third process chamber is provided in the process furnace 202c. An inner configuration of process chamber 201c of the process furnace 202c according to the present embodiment is different from that of the process chamber 201b of the process furnace 202b described above. In the process furnace 202c, portions different from those of the process furnace 202b will be described in detail below, and the description of portions the same as the process furnace 202b will be omitted.

According to the present embodiment, the process furnace 202c is used as a film-forming structure (which is a film-forming apparatus) configured to perform the film-forming process.

Nozzles 420 and 430 are installed in the process chamber 201c so as to penetrate side walls of the manifold 209 and the inner tube 204. Gas supply pipes 320 and 330 are connected to the nozzles 420 and 430, respectively.

MFCs 322 and 332 and valves 324 and 334 are sequentially installed at the gas supply pipes 320 and 330 from upstream sides to downstream sides of the gas supply pipes 320 and 330, respectively. Gas supply pipes 520 and 530 configured to supply the inert gas are connected to the gas supply pipes 320 and 330 at downstream sides of the valves 324 and 334, respectively. MFCs 522 and 532 and valves 524 and 534 are sequentially installed at the gas supply pipes 520 and 530 from upstream sides to downstream sides of the gas supply pipes 520 and 530, respectively.

The nozzles 420 and 430 are connected to front ends (tips) of the gas supply pipes 320 and 330, respectively. Each of the nozzles 420 and 430 may include an L-shaped nozzle. Horizontal portions of the nozzles 420 and 430 are installed so as to penetrate the side walls of the manifold 209 and the inner tube 204. Vertical portions of the nozzles 420 and 430 protrude outward in the radial direction of the inner tube 204 and are installed in a spare chamber 205c of a channel shape (a groove shape) extending in the vertical direction. That is, the vertical portions of the nozzles 420 and 430 are installed in the spare chamber 205c toward the upper end of the inner tube 204 (in the direction in which the plurality of the wafers including the wafer 200 are arranged) and along the inner wall of the inner tube 204.

The nozzles 420 and 430 extend from a lower region of the process chamber 201c to an upper region of the process chamber 201c. The nozzles 420 and 430 are provided with a plurality of gas supply holes 420a and a plurality of gas supply holes 430a facing the plurality of the wafers including the wafer 200, respectively.

The plurality of the gas supply holes 420a of the nozzle 420 and the plurality of the gas supply holes 430a of the nozzle 430 are provided from the lower portion to the upper portion of the boat 217 described later. Therefore, the process gas supplied into the process chamber 201c through the plurality of the gas supply holes 420a of the nozzle 420 and the plurality of the gas supply holes 430a of the nozzle 430 is supplied onto the plurality of the wafers including the wafer 200 accommodated in the boat 217 from the lower portion to the upper portion thereof, that is, the entirety of the plurality of the wafers accommodated in the boat 217.

A source gas such as the deposition gas serving as the process gas is supplied into the process chamber 201c through the gas supply pipe 320 provided with the MFC 322 and the valve 324 and the nozzle 420. As the source gas, for example, a chlorine (Cl)-containing gas containing an electrically negative ligand and serving as a third halogen-based material may be used. For example, silicon tetrachloride (SiCl$_4$) gas may be used as the chlorine-containing gas.

A reactive gas such as the deposition gas serving as the process gas and reacting with the source gas is supplied into the process chamber 201c through the gas supply pipe 330 provided with the MFC 332 and the valve 334 and the nozzle 430. As the reactive gas, for example, a nitrogen (N)-containing gas containing nitrogen may be used. For example, ammonia (NH$_3$) gas may be used as the nitrogen-containing gas.

the inert gas such as the nitrogen (N$_2$) gas is supplied into the process chamber 201c through the gas supply pipes 520 and 530 provided with the MFCs 522 and 532 and the valves 524 and 534, respectively, and the nozzles 420 and 430.

A fourth gas supply system (deposition gas supply system) configured to supply the deposition gas is constituted mainly by the gas supply pipes 320 and 330, the MFCs 322 and 332, the valves 324 and 334 and the nozzles 420 and 430. However, only the nozzles 420 and 430 may be considered as the fourth gas supply system. When the source gas is supplied through the gas supply pipe 320, a source gas supply system is constituted mainly by the gas supply pipe 320, the MFC 322 and the valve 324. The source gas supply system may further include the nozzle 420. When the reactive gas is supplied through the gas supply pipe 330, a reactive gas supply system is constituted mainly by the gas supply pipe 330, the MFC 332 and the valve 334. The reactive gas supply system may further include the nozzle 430. When the nitrogen-containing gas serving as the reactive gas is supplied through the gas supply pipe 330, the reactive gas supply system may also be referred to as a "nitrogen-containing gas supply system". An inert gas supply system is constituted mainly by the gas supply pipes 520 and 530, the MFCs 522 and 532 and the valves 524 and 534. The fourth gas supply system may further include the inert gas supply system.

Configuration of Process Furnace 202d

A configuration of the process furnace 202d according to the present embodiment is similar to that of the process furnace 202b described above shown in FIG. 4. A process chamber 201d serving as a fourth process chamber is provided in the process furnace 202d.

According to the present embodiment, the process furnace 202d is used as an etching structure (which is an etching apparatus) configured to perform an etching process.

A nozzle 440 is installed in the process chamber 201d so as to penetrate side walls of the manifold 209 and the inner tube 204. A gas supply pipe 340 is connected to the nozzle 440.

An MFC 342 and a valve 344 are sequentially installed at the gas supply pipe 340 from an upstream side to a downstream side of the gas supply pipe 340. A gas supply pipe 540 configured to supply the inert gas is connected to the gas supply pipe 340 at a downstream side of the valve 344. An MFC 542 and a valve 544 are sequentially installed at the gas supply pipe 540 from an upstream side to a downstream side of the gas supply pipe 540.

The nozzle 440 is connected to a front end (tip) of the gas supply pipe 340. The nozzle 440 may include an L-shaped nozzle. A horizontal portion of the nozzle 440 is installed so as to penetrate the side walls of the manifold 209 and the inner tube 204. A vertical portion of the nozzle 440 protrudes outward in the radial direction of the inner tube 204 and is installed in a spare chamber 205d of a channel shape (a groove shape) extending in the vertical direction. That is, the vertical portion of the nozzle 440 is installed in the spare chamber 205d toward the upper end of the inner tube 204 (in the direction in which the plurality of the wafers including the wafer 200 are arranged) and along the inner wall of the inner tube 204.

The nozzle 440 extends from a lower region of the process chamber 201d to an upper region of the process chamber

201d. The nozzle 440 is provided with a plurality of gas supply holes 440a facing the plurality of the wafers including the wafer 200.

The plurality of the gas supply holes 440a of the nozzle 440 are provided from the lower portion to the upper portion of the boat 217 described later. Therefore, the process gas supplied into the process chamber 201d through the plurality of the gas supply holes 440a of the nozzle 440 is supplied onto the plurality of the wafers including the wafer 200 accommodated in the boat 217 from the lower portion to the upper portion thereof, that is, the entirety of the plurality of the wafers accommodated in the boat 217.

An etching gas is supplied into the process chamber 201d through the gas supply pipe 340 provided with the MFC 342 and the valve 344 and the nozzle 440. For example, chlorine trifluoride ($ClF_3$) gas may be used as the etching gas.

The inert gas such as the nitrogen ($N_2$) gas is supplied into the process chamber 201d through the gas supply pipe 540 provided with the MFC 542 and the valve 544 and the nozzle 440.

A fifth gas supply system (etching gas supply system) is constituted mainly by the gas supply pipe 340, the MFC 342, the valve 344 and the nozzle 440. However, only the nozzle 440 may be considered as the fifth gas supply system. The fifth gas supply system may also be referred to as a "process gas supply system" or may be simply referred to as a "gas supply system". An inert gas supply system is constituted mainly by the gas supply pipe 540, the MFC 542 and the valve 544. The fifth gas supply system may further include the inert gas supply system.

Configuration of Controller

Figure 8:
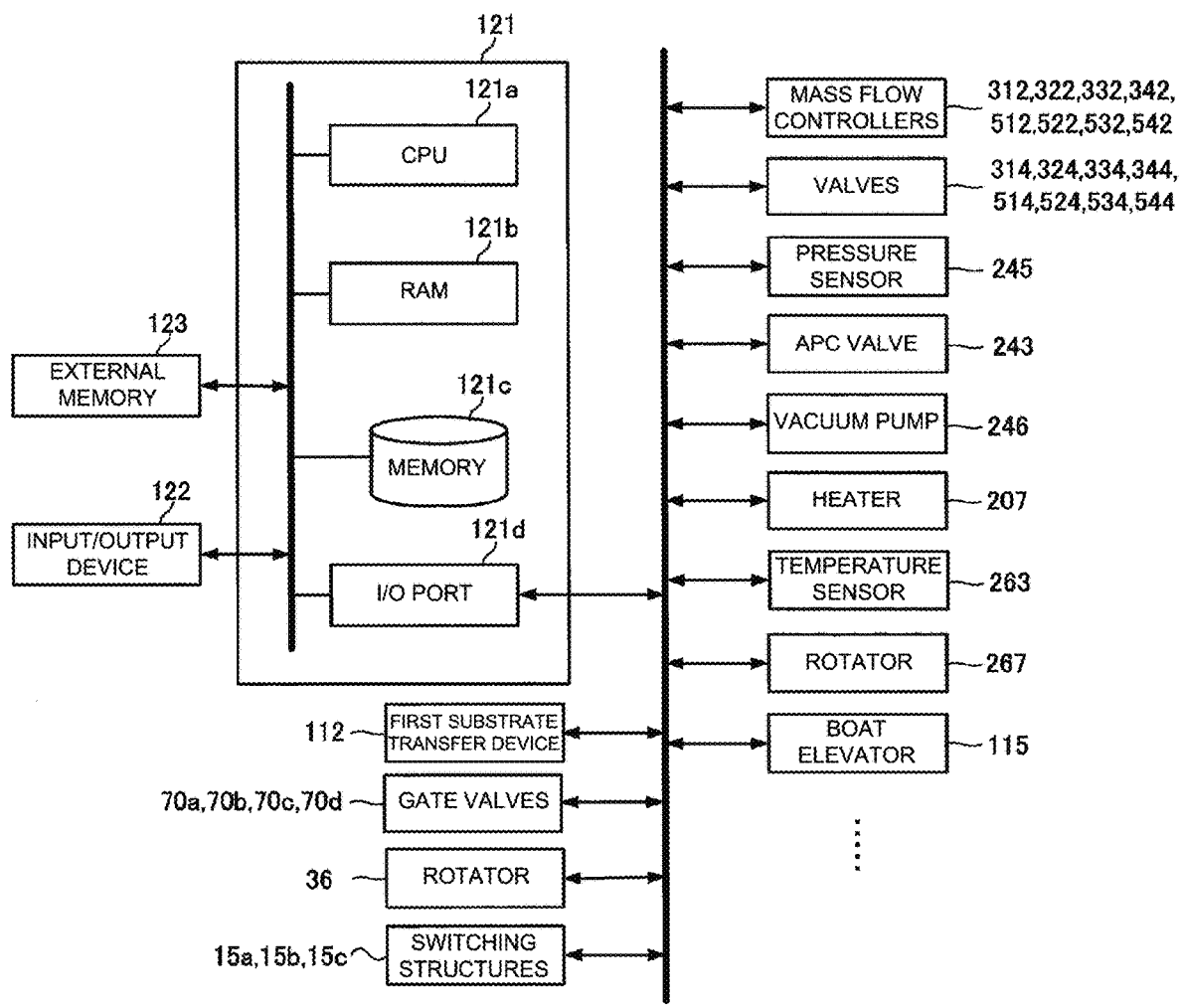
FIG. 8 is a block diagram schematically illustrating a configuration of a controller and related components of the substrate processing apparatus 10 according to the embodiment of the present disclosure.
Figure 9:
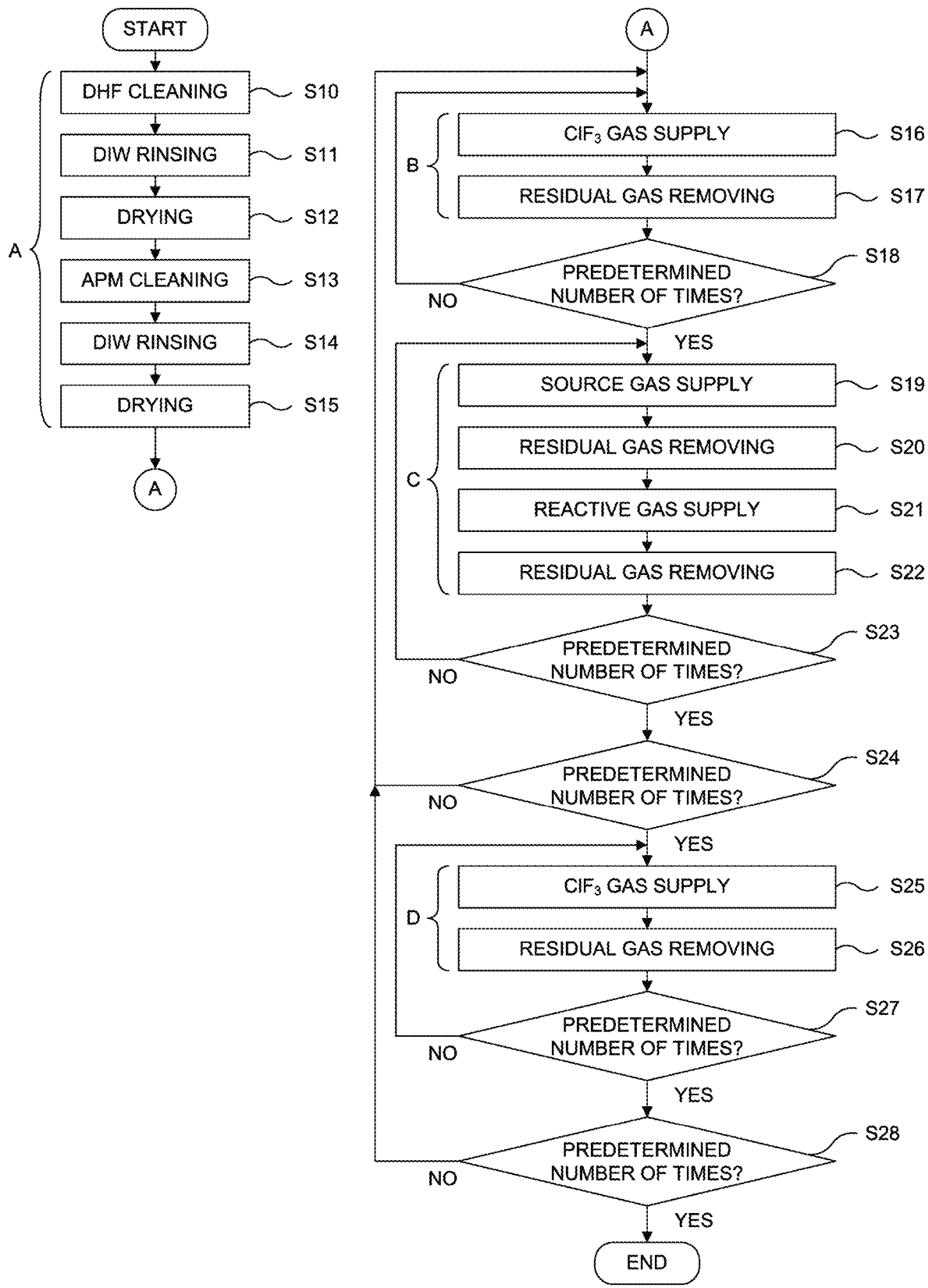
FIG. 9 is a flow chart schematically illustrating a control flow by the controller of the substrate processing apparatus 10 according to the embodiment of the present disclosure.

As shown in FIG. 8, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 121.

The memory 121c is configured by components such as a flash memory and a hard disk drive (HDD). For example, a control program configured to control the operation of the substrate processing apparatus 10 or a process recipe containing information on the sequences and conditions of a method of manufacturing a semiconductor device described later is readably stored in the memory 121c. The process recipe is obtained by combining steps of the method of manufacturing the semiconductor device described later such that the controller 121 can execute the steps to acquire a predetermine result, and functions as a program. Hereafter, the process recipe and the control program may be collectively or individually referred to as a "program". In the present specification, the term "program" may indicate only the process recipe, may indicate only the control program, or may indicate a combination of the process recipe and the control program. The RAM 121b functions as a memory area (work area) where a program or data read by the CPU 121a is temporarily stored.

The I/O port 121d is connected to the above-described components such as the first substrate transfer device 112, the gate valves 70a, 70b, 70c and 70d, the rotator 36, the switching structures 15a, 15b and 15c, the MFCs 312, 322, 332, 342, 512, 522, 532 and 542, the valves 314, 324, 334, 344, 514, 524, 534 and 544, the pressure sensor 245, the APC valve 243, the vacuum pump 246, the heater 207, the temperature sensor 263, the rotator 267 and the boat elevator 115.

The CPU 121a is configured to read a control program from the memory 121c and execute the read control program. In addition, the CPU 121a is configured to read a recipe from the memory 121c in accordance with an operation command inputted from the input/output device 122.

According to the contents of the read recipe, the CPU 121a may be configured to control various operations such as a rotating operation of the support 34 by the rotator 36, opening/closing operations of the gate valves 70a, 70b, 70c and 70d, a loading and unloading operation of the wafer 200 by the first substrate transfer device 112, a supply operation of the DHF and the SC1 liquid through the nozzle 40, a supply operation of the DIW through the nozzle 42, a supply operation of the cleaning liquid into the pipes 16a, 16b and 21, switching operations of the switching structures 15a, 15b and 15c, a supply operation of the pure water through the water supplier 50 and a supply operation of the nitrogen ($N_2$) through the drying gas supply pipe 56.

According to the contents of the read recipe, the CPU 121a may be configured to control various operations such as flow rate adjusting operations for various gases by the MFCs 312, 322, 332, 342, 512, 522, 532 and 542, opening/closing operations of the valves 314, 324, 334, 344, 514, 524, 534 and 544, an opening/closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring the wafer 200 into the boat 217.

That is, the controller 121 is configured to control various systems such as the transfer system including the first substrate transfer device 112, the first gas supply system and the second gas supply system of the process furnace 202a, the third gas supply system of the process furnace 202b, the fourth gas supply system of the process furnace 202c and the fifth gas supply system of the process furnace 202d.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as recording media. In the present specification, the term "recording media" may indicate only the memory 121c, may indicate only the external memory 123, and may indicate both of the memory 121c and the external memory 123. Instead of the external memory 123, a communication means such as the Internet and a dedicated line may be used for providing the program to the computer.

(2) Substrate Processing

Hereinafter, as a part of manufacturing processes of a semiconductor device, an exemplary processing (substrate processing) of forming a silicon nitride film (SiN film) on the wafer 200 with a silicon layer (Si layer), a silicon oxide layer (Sift layer) and a silicon nitride layer (SiN layer) formed on the surface of the wafer 200 will be described with reference to FIGS. 9 through 12. According to the substrate processing, a process of removing the natural oxide film from the surface of the wafer 200 and a process of re-forming the oxide film on the Si layer of the wafer 200 are performed in the process furnace 202a. Then, a process of modifying a surface of the Si layer and a surface of the SiO$_2$ layer is performed in the process furnace 202b. Then, a process of selectively growing the SiN film on the SiN layer of the wafer 200 is performed in the process furnace 202c. Then, a process of etching the SiN film slightly formed on the surface of the Si layer and the surface of the SiO$_2$ layer of the wafer 200 is performed in the process furnace 202d. In the following description, the operations of the components constituting the substrate processing apparatus 10 are controlled by the controller 121.

In the substrate processing (that is, the manufacturing processes of the semiconductor device) according to the present embodiment, a step of removing the natural oxide film from the surface of the wafer 200 by supplying the DHF serving as the first inorganic material to the wafer 200 wherein at least the Si layer serving as a first film and the SiN layer serving as a second film different from the first film are exposed on the surface of the wafer 200; a step of re-forming the oxide film by oxidizing a surface of the Si layer by supplying the SC1 liquid serving as the oxidizing agent to the wafer 200; a step of modifying a surface of the Si layer by supplying the ClF$_3$ gas serving as the second inorganic material to the wafer 200; and a step of selectively growing the SiN film serving as a film on the surface of the SiN layer by supplying the SiCl$_4$ gas and the NH$_3$ gas serving as the deposition gas to the wafer 200 are sequentially performed.

Further, in the substrate processing, a step of etching the SiN film slightly formed on the surface of the Si layer by supplying the etching gas to the wafer 200 is performed.

In the present specification, the term "wafer" may refer to "a wafer itself" or may refer to "a wafer and a stacked structure of a predetermined layer (or layers) or a film (or films) formed on a surface of the wafer". In the present specification, the term "a surface of a wafer" may refer to "a surface of a wafer itself" or may refer to "a surface of a predetermined layer or a film formed on a wafer". In the present specification, the term "substrate" and "wafer" may be used as substantially the same meaning.

A. Cleaning Process (Cleaning Step)

First, the wafer 200 with the Si layer, the SiO2 layer and the SiN layer formed on the surface thereof is transferred (loaded) into the process furnace 202a serving as the first processing structure. Then, the process of removing the natural oxide film and the process of re-forming the oxide film on the surface of the Si layer are performed.

Wafer Loading

The substrate loading/unloading port 33 is opened by the gate valve 70a, and the wafer 200 with the Si layer, the SiO$_2$ layer and the SiN layer formed on the surface thereof is loaded into the cleaning chamber 30 by the first substrate transfer device 112. Patterns may be formed on the Si layer, the SiO$_2$ layer or the SiN layer.

Then, by controlling the first substrate transfer device 112, the wafer 200 is supported (set) on the support 34, and the substrate loading/unloading port 33 is closed by the gate valve 70a.

Then, the rotator 36 rotates the support 34 via the rotating shaft 37 to start the rotation of the wafer 200.

A-1: Natural Oxide Film Removing Step

First, the process of removing the natural oxide film from the surface of the wafer 200 is performed in the process furnace 202a.

DHF Cleaning: Step S10

While maintaining the rotation of the wafer 200, the switching structure 15a is switched to the DHF supplier 14, and the surface of the wafer 200 is cleaned by supplying the DHF through the nozzle 40 via the pipe 16a.

DIW Rinsing: Step S11

Then, while maintaining the rotation of the wafer 200, the supply of the DHF through the nozzle 40 is stopped, the switching structure 15c is switched to the DIW supplier 18, and the DHF remaining on the surface of the wafer 200 is washed away and rinsed by supplying the DIW serving as the rinse liquid toward the center of the wafer 200 through the nozzle 42 via the pipe 21.

Then, while maintaining the rotation of the wafer 200, the supply of the DIW through the nozzle 42 is stopped, and the liquid such as the DIW on the wafer 200 is removed by a centrifugal force due to the rotation.

Drying: Step S12

Then, the N$_2$ serving as the drying gas is supplied to the cleaning chamber 30 through the drying gas supply pipe 56 and exhausted through the exhaust pipe 60 so as to adjust an inner atmosphere of the cleaning chamber 30 to the N$_2$ atmosphere. The wafer 200 is dried in the N$_2$ atmosphere. It is preferable that the water is continuously supplied through the water supplier 50 to the inner surface of the cover 38 in the DHF cleaning in the step S10, the DIW rinsing in the step S11 and the drying in the step S12 in order to enhance the reliability. That is, it is preferable to supply the pure water to the inner surface of the cover 38 while at least the chemical solution such as the DHF and the DIW scatters from the wafer 200 to the cover 38. It is also preferable to supply the pure water to the inner surface of the cover 38 in an oxide film re-forming step described later.

Then, when the surface of the wafer 200 is dried, the supply of the N$_2$ into the cleaning chamber 30 is stopped.

Figure 10A:
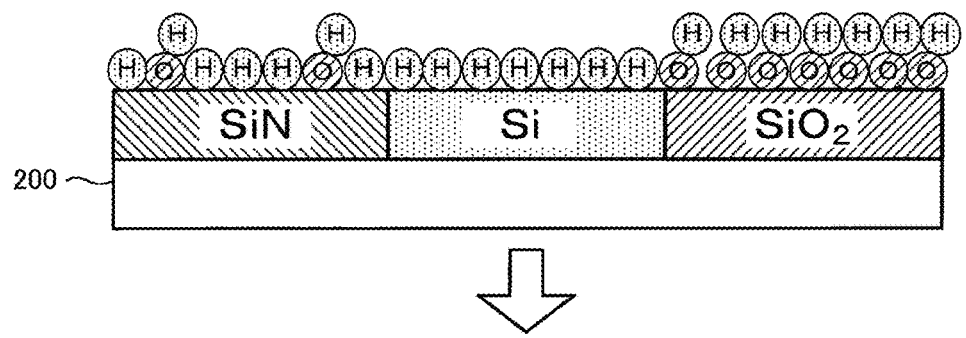
FIG. 10A is a model diagram schematically illustrating a state of a surface of a wafer with a silicon layer (Si layer), a silicon oxide layer (Sift layer) and a silicon nitride layer (SiN layer) formed thereon after a natural oxide film removing step is performed.

According to the steps of the natural oxide film removing step, as shown in FIG. 10A, deposits such as an organic substance and the natural oxide film formed on the surfaces of the Si layer, the SiO$_2$ layer, and the SiN layer of the wafer 200 are removed. That is, according to the steps of the natural oxide film removing step, the natural oxide film on the Si layer is also removed.

A-2: Oxide Film Re-Forming Step

Subsequently, the process of re-forming the oxide film on the surface of the Si layer by oxidizing the surface of the Si layer on the wafer 200 is performed.

APM (Ammonia Peroxide Mixture) Cleaning (SC1 Cleaning): Step S13

Figure 10B:
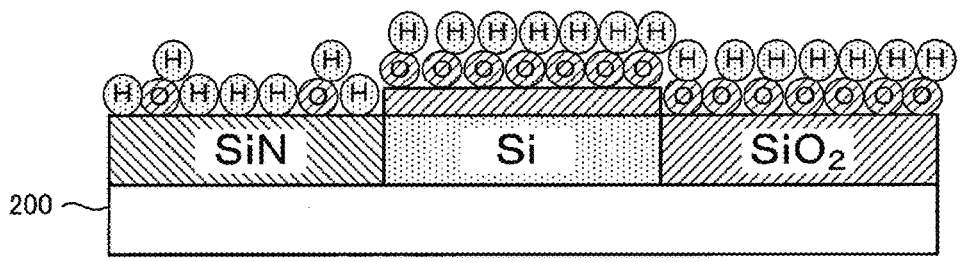
FIG. 10B is a model diagram schematically illustrating a state of the surface of the wafer after an oxide film re-forming step is performed.

While maintaining the rotation of the wafer 200, the switching structure 15b is switched to the SC1 liquid supplier 17, and the surface of the wafer 200 is cleaned by supplying the SC1 liquid through the nozzle 40 via the pipe 16b. By supplying the SC1 liquid, as shown in FIG. 10B, the surface of the Si layer is preferentially oxidized by a chemical action to form a thin oxide film (SiO$_2$ film) of about 1 nm. OH terminations are also formed on the surface of the SiO$_2$ layer and on the surface of the SiO$_2$ film on the surface of the Si layer. In the step S13, since the surface of the SiN layer is not easily oxidized, the hydrogen molecules remain on the surface of the SiN layer. By adjusting the respective concentrations of the solutions contained in the SC1 liquid and the supply time of the SC1 liquid, it is possible to control a thickness of the oxide film formed on the surface of the Si layer. In the step S13, the surface of the SiN layer is hardly oxidized and the oxide film is not formed on the surface of the SiN layer. By coating the surface of the Si layer with the thin oxide film by the chemical action, it is possible to prevent the surface of the Si layer from being directly damaged by the modifying process with the fluorine-containing gas performed as the subsequent step.

DIW Rinsing: Step S14

Then, while maintaining the rotation of the wafer 200, the supply of the SC1 liquid through the nozzle 40 is stopped, the switching structure 15c is switched to the DIW supplier 18, and the SC1 liquid remaining on the surface of the wafer 200 is washed away and rinsed by supplying the DIW serving as the rinse liquid toward the center of the wafer 200 through the nozzle 42 via the pipe 21.

Then, while maintaining the rotation of the wafer 200, the supply of the DIW through the nozzle 42 is stopped, and the liquid such as the DIW on the wafer 200 is removed by the centrifugal force due to the rotation.

Drying: Step S15

Then, the $N_2$ serving as the drying gas is supplied to the cleaning chamber 30 through the drying gas supply pipe 56 and exhausted through the exhaust pipe 60 so as to adjust the inner atmosphere of the cleaning chamber 30 to the $N_2$ atmosphere. The wafer 200 is dried in the $N_2$ atmosphere.

Then, the rotation of the wafer 200 is stopped by stopping the rotation of the support 34 by the rotator 36. The supply of the $N_2$ into the cleaning chamber 30 is stopped.

Then, the substrate loading/unloading port 33 is opened by the gate valve 70a, and the wafer 200 is transferred (unloaded) out of the cleaning chamber 30 by the first substrate transfer device 112.

The oxide film formed on the surface of the Si layer by performing the steps of the oxide film re-forming step functions as a protective film for the Si layer. Thus, it is possible to suppress the etching of the Si layer by fluorine components contained in the $ClF_3$ gas exposed in the subsequent modifying process.

B. Modifying Process (Pre-Processing) Modifying Step (Pre-Processing)

Subsequently, the wafer 200 is loaded into the process furnace 202b serving as the second processing structure, and the modifying process of supplying the modifying gas to the surface of the $SiO_2$ layer and the surface of the $SiO_2$ film on the surface of the Si layer formed in the cleaning process described above is performed. The modifying gas serves as the adsorption control agent capable of suppressing the adsorption of the source gas.

Wafer Loading

The plurality of the wafers including the wafer 200 are charged (transferred) into the boat 217 (wafer charging). After the boat 217 is charged with the plurality of the wafers, as shown in FIG. 4, the boat 217 charged with the plurality of the wafers is elevated by the boat elevator 115 and loaded (transferred) into the process chamber 201b (boat loading). With the boat 217 loaded, the seal cap 219 seals a lower end opening of the outer tube 203 via the O-ring 220b.

Pressure and Temperature Adjusting

The vacuum pump 246 vacuum-exhausts the inner atmosphere of the process chamber 201b until the inner pressure of the process chamber 201b reaches and is maintained at a desired pressure (vacuum degree). In the pressure and temperature adjusting, the inner pressure of the process chamber 201b is measured by the pressure sensor 245, and the APC valve 243 is feedback-controlled based on measured pressure information (pressure adjusting). The vacuum pump 246 continuously vacuum-exhausts the inner atmosphere of the process chamber 201b until at least the processing of the wafer 200 is completed. The heater 207 heats the process chamber 201b until the inner temperature of the process chamber 201b reaches and is maintained at a desired temperature. In the pressure and temperature adjusting, the amount of the current supplied to the heater 207 is feedback-controlled based on the temperature information detected by the temperature sensor 263 such that the desired temperature distribution of the inner temperature of the process chamber 201b is obtained (temperature adjusting). The heater 207 continuously heats the process chamber 201b until at least the processing of the wafer 200 is completed.

B-1: Modifying Gas Supply Step $ClF_3$ Gas Supply: Step S16

The valve 314 is opened to supply the $ClF_3$ gas serving as the modifying gas into the gas supply pipe 310. A flow rate of the $ClF_3$ gas supplied into the gas supply pipe 310 is adjusted by the MFC 312. The $ClF_3$ gas whose flow rate is adjusted is then supplied into the process chamber 201b through the plurality of the gas supply holes 410a of the nozzle 410, and is exhausted through the exhaust pipe 231. Thereby, the $ClF_3$ gas is supplied to the plurality of the wafers including the wafer 200. In parallel with the supply of the $ClF_3$ gas, the valve 514 is opened to supply the inert gas such as the $N_2$ gas into the gas supply pipe 510. A flow rate of the $N_2$ gas supplied into the gas supply pipe 510 is adjusted by the MFC 512. The $N_2$ gas whose flow rate is adjusted is then supplied into the process chamber 201b together with the $ClF_3$ gas, and is exhausted through the exhaust pipe 231.

In the step S16, the APC valve 243 is appropriately adjusted (controlled) to adjust the inner pressure of the process chamber 201b to a pressure ranging from 1 Pa to 1,000 Pa. A supply flow rate of the $ClF_3$ gas controlled by the MFC 312 may be set to a flow rate ranging from 1 sccm to 1,000 sccm. A supply flow rate of the $N_2$ gas controlled by the MFC 512 may be set to a flow rate ranging from 100 sccm to 10,000 sccm. The time duration of supplying the $ClF_3$ gas to the wafer 200 may be set to a time ranging from 1 second to 3,600 seconds. In the step S16, a temperature of the heater 207 is set such that the temperature of the wafer 200 reaches and is maintained at a temperature ranging from 30° C. to 300° C., preferably from 30° C. to 250° C., and more preferably from 30° C. to 200° C. For example, the numerical range of the temperature ranging "30° C. to 200° C." means a temperature equal to or more than 30° C. and equal to or less than 200° C. The same also applies to all numerical ranges described herein such as the pressure, the time (time duration) and the flow rate.

Figure 10C:
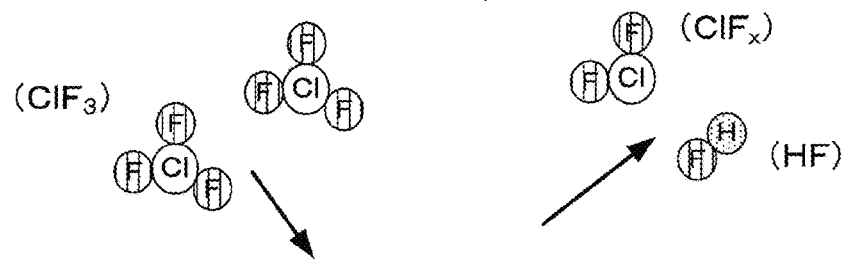
FIG. 10C is a model diagram schematically illustrating a state of the surface of the wafer immediately after $ClF_3$ gas is supplied.
Figure 10C:
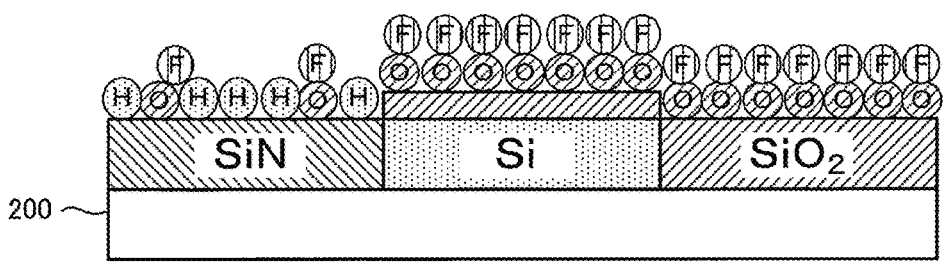

In the step S16, the $ClF_3$ gas and the $N_2$ gas are supplied into the process chamber 201b. As shown in FIG. 10C, by supplying the $ClF_3$ gas, the hydrogen molecules at the OH terminations formed on the surface of the $SiO_2$ layer and on the surface of the Sift film on the Si layer are replaced with fluorine (F) molecules to form fluorine (F) terminations, and then, the fluorine molecules are adsorbed on the oxide film. When the fluorine molecules are adsorbed on the oxide film, the fluorine molecules are hardly adsorbed on the SiN layer of the wafer 200. In the step S16, components such as ClFx and HF on the surface of the wafer 200 are reacted and desorbed.

After a predetermined time has elapsed from the supply of the $ClF_3$ gas, the valve 314 of the gas supply pipe 310 is closed to stop the supply of the $ClF_3$ gas.

B-2: Purge Step

Residual Gas Removing: Step S17

Subsequently, after the supply of the $ClF_3$ gas is stopped, a purge process (purge step) of exhausting the gas in the process chamber 201b is performed. In the step S17, with the APC valve 243 of the exhaust pipe 231 open, the vacuum pump 246 vacuum-exhausts the inner atmosphere of the process chamber 201b to remove a residual gas in the process chamber 201b such as the ClF$_3$ gas which did not react, the ClF$_3$ gas after the fluorine molecules thereof are adsorbed on the oxide film, the ClFx gas and the HF gas from the process chamber 201b. In the step S17, with the valve 514 open, the N$_2$ gas is continuously supplied into the process chamber 201b. The N$_2$ gas serves as a purge gas, which improves the efficiency of removing the residual gas in the process chamber 201b such as the ClF$_3$ gas which did not react and the ClF$_3$ gas after the fluorine molecules thereof are adsorbed on the oxide film from the process chamber 201b.

Performing a Predetermined Number of Times: Step S18

By performing a cycle wherein the step S16 and the step S17 described above are sequentially performed in order one or more times (a predetermined number of times, m times), the fluorine molecules are adsorbed on the oxide film formed on the surface of the Si layer of the wafer 200. The fluorine molecules are not adsorbed on the surface of the SiN layer of the wafer 200.

After-Purge and Returning to Atmospheric Pressure

The N$_2$ gas is supplied into the process chamber 201b through the gas supply pipe 510, and is exhausted through the exhaust pipe 231. The N$_2$ gas serves as the purge gas, and the inner atmosphere of the process chamber 201b is purged with the N$_2$ gas. Thus, the residual gas in the process chamber 201b or by-products remaining in the process chamber 201b are removed from the process chamber 201b (after-purge). Thereafter, the inner atmosphere of the process chamber 201b is replaced with the inert gas (substitution by inert gas), and the inner pressure of the process chamber 201b is returned to the normal pressure (atmospheric pressure) (returning to atmospheric pressure).

Wafer Unloading

Thereafter, the seal cap 219 is lowered by the boat elevator 115 and the lower end opening of the outer tube 203 is opened. The boat 217 with the plurality of modified wafers including the wafer 200 charged therein is unloaded out of the outer tube 203 through the lower end opening of the outer tube 203 (boat unloading). Then, the plurality of the modified wafers including the wafer 200 are discharged (transferred) out of the boat 217 (wafer discharging).

C. Film-Forming Process: Film-Forming Step (Selectively Growing Step)

Subsequently, the wafer 200 is loaded into the process furnace 202c serving as the third processing structure, and a process of selectively growing a nitride film serving as the film on the surface of the SiN layer is performed.

After an inner pressure and an inner temperature of the process furnace 202c are adjusted to a desired pressure and a desired temperature distribution, the film-forming process is performed. Gas supply steps of the film-forming process are different from those of the modifying process performed in the process furnace 202b described above. In the film-forming step, steps of the film-forming process different from those of the modifying process performed in the process furnace 202b will be described in detail below, and the description of steps of the film-forming process the same as those of the modifying process performed in the process furnace 202b will be omitted.

C-1: First Step

Source Gas Supply: Step S19

The valve 324 is opened to supply the SiCl$_4$ gas serving as the source gas into the gas supply pipe 320. A flow rate of the SiCl$_4$ gas supplied into the gas supply pipe 320 is adjusted by the MFC 322. The SiCl$_4$ gas whose flow rate is adjusted is then supplied into the process chamber 201c through the plurality of the gas supply holes 420a of the nozzle 420, and is exhausted through the exhaust pipe 231. Thereby, the SiCl$_4$ gas is supplied to the plurality of the wafers including the wafer 200. In parallel with the supply of the SiCl$_4$ gas, the valve 524 is opened to supply the inert gas such as the N$_2$ gas into the gas supply pipe 520. A flow rate of the N$_2$ gas supplied into the gas supply pipe 520 is adjusted by the MFC 522. The N$_2$ gas whose flow rate is adjusted is then supplied into the process chamber 201c together with the SiCl$_4$ gas, and is exhausted through the exhaust pipe 231. In the step S19, in order to prevent the SiCl$_4$ gas from entering the nozzle 430, the valve 534 may be opened to supply the N$_2$ gas into the gas supply pipe 530. The N$_2$ gas is supplied into the process chamber 201c through the gas supply pipe 330 and the nozzle 430, and is exhausted through the exhaust pipe 231.

In the step S19, the APC valve 243 is appropriately adjusted (controlled) to adjust the inner pressure of the process chamber 201c to a pressure ranging from 1 Pa to 1,000 Pa. For example, the inner pressure of the process chamber 201c is adjusted to 100 Pa. A supply flow rate of the SiCl$_4$ gas controlled by the MFC 322 may be set to a flow rate ranging from 0.05 slm to 5 slm. A supply flow rate of the N$_2$ gas controlled by each of the MFCs 522 and 532 may be set to a flow rate ranging from 0.1 slm to 10 slm. The time duration of supplying the SiCl$_4$ gas to the wafer 200 may be set to a time ranging from 0.1 second to 1,000 seconds. In the step S19, the temperature of the heater 207 is set such that the temperature of the wafer 200 reaches and is maintained at a temperature ranging from 300° C. to 700° C., preferably from 300° C. to 600° C., and more preferably from 300° C. to 550° C.

Figure 11A:
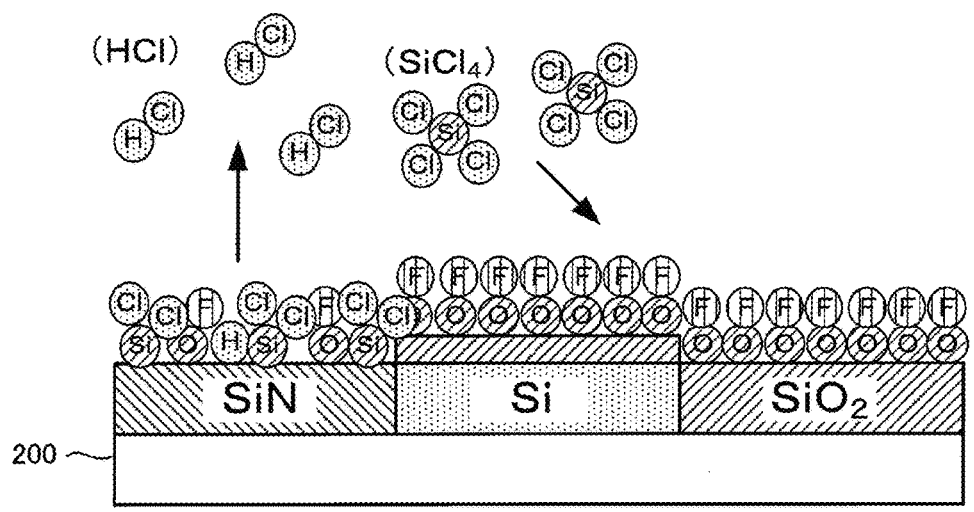
FIG. 11A is a model diagram schematically illustrating a state of the surface of the wafer with the Si layer, the $SiO_2$ layer and the SiN layer formed on the surface thereof immediately after $SiCl_4$ gas is supplied.

In the step S19, the SiCl$_4$ gas and the N$_2$ gas are supplied into the process chamber 201c. As shown in FIG. 11A, the SiCl$_4$ gas is difficult to be adsorbed on the oxide film with the fluorine molecules adsorbed on the surface thereof by the modifying process described above. The SiCl$_4$ gas is chemically adsorbed on the SiN layer in the form of SiClx by releasing chlorine (Cl) of the SiCl$_4$ gas, and reacted and desorbed as the HCl gas. The halogen (Cl) contained in the SiCl$_4$ gas and the halogen (F) on the oxide film are electrically negative ligands, which serve as a repulsive factor. Thus, the SiCl$_4$ gas is difficult to be adsorbed on the oxide film with the fluorine molecules adsorbed on the surface thereof. That is, since an incubation time is lengthened on the oxide film, it is possible to selectively grow the SiN film on the surface of the SiN layer other than the oxide film. In the present embodiment, the incubation time refers to the time duration until a film starts to grow on the surface of the wafer 200.

When the film is selectively formed on a specific surface of the wafer 200 according to the present embodiment, the source gas may be adsorbed on an unintended portion of the wafer surface on which the film is not desired to be formed to thereby cause an unintended film-forming. That is, the selectivity is broken. The selectivity of the film-forming process may easily be broken when an adsorption probability for the molecules of the source gas to be adsorbed on the unintended portion of the wafer surface is high. That is, it is possible to improve the selectivity by lowering the adsorption probability for the molecules of the source gas to be adsorbed on the unintended surface of the wafer 200 where the film is not desired to be formed.

The source gas is adsorbed on the surface of the wafer 200 when the source gas stays on the surface of the wafer 200 for a certain period of time due to the electrical interaction between the molecules of the source gas molecules and the surface of the wafer 200. That is, the adsorption probability depends on both an exposure density of the source gas (or its decomposition product) with respect to the wafer 200 and the electrochemical factor of the wafer itself. In the present embodiment, the electrochemical factor of the wafer itself often refers to, for example, surface defects of the wafer 200 at an atomic level, or the electric charging due to factors such as the polarization and the electric field. That is, the source gas is likely to be adsorbed on the surface of the wafer 200 when the surface of the wafer 200 and the source gas are easily attracted to each other due to the electrochemical factors of the wafer surface.

That is, as the modifying gas of modifying the surface of the oxide film on the wafer 200, it is preferable to use a material containing molecules whose adsorptivity to the oxide film is strong. In addition, as the modifying gas, it is preferable to use a material that does not etch the oxide film even when it is exposed to the oxide film at a low temperature.

As the modifying gas of modifying the surface of the oxide film on the wafer 200, an organic substance and an inorganic substance may be considered. A heat resistance of the surface modified by the organic substance is low. Further, when a film-forming temperature reaches 500° C. or higher, the selectivity is broken and the adsorption between the organic substance and silicon may be ruined. That is, when the film-forming process is performed at a high film-forming temperature of 500° C. or higher, the selectivity is broken. On the other hand, a heat resistance of the surface modified by the inorganic substance is high. Further, even when the film-forming temperature reaches 500° C. or higher, the adsorption between the inorganic substance and silicon remains intact. For example, fluorine (F) is a strong passivation agent, and an adsorptive power thereof is strong.

Therefore, by using the inorganic substance such as a halide containing element such as fluorine (F), chlorine (Cl), iodine (I) and bromine (Br) as the modifying gas, it is possible to selectively grow the film using the modifying gas even when the film is formed by the film-forming process at the high film-forming temperature of 500° C. or higher. For example, when the film-forming process is performed at the high film-forming temperature, the modifying process can be performed at a low temperature of 250° C. or lower, and the film can be selectively grown by the film-forming process at the high film-forming temperature of 500° C. or higher. As the modifying gas, it is preferable to use the halide whose binding energy is particularly high. The binding energy of the fluorine-containing gas is the highest among the halides, and the adsorptive power of the fluorine-containing gas is strong.

Then, as the source gas used for selectively growing the film, a gas containing an electrically negative molecule is used. Since the modifying gas of modifying the surface of the oxide film on the wafer 200 is an electrically negative halide, the electrically negative molecule of the source gas and the electrically negative halide repel each other. As a result, it is difficult to bond the electrically negative molecule of the source gas and the electrically negative halide. It is preferable that the source gas contains only one source molecule such as a metal element and a silicon element. When two or more source molecules are contained in the source gas, for example, when two silicon molecules are contained, a Si—Si bond may be disengaged, and the silicon and fluorine may be bonded. As a result, the selectivity may be broken.

C-2: Second Step
Residual Gas Removing: Step S20

After a silicon-containing layer is formed on the SiN layer, the valve 324 is closed to stop the supply of the $SiCl_4$ gas. Then, a residual gas in the process chamber 201c such as the $SiCl_4$ gas which did not react or which contributed to the formation of the silicon-containing layer and reaction byproducts is removed from the process chamber 201c.

C-3: Third Step
Reactive Gas Supply: Step S21

After the residual gas in the process chamber 201c is removed from the process chamber 201c, the valve 334 is opened to supply the $NH_3$ gas serving as the reactive gas into the gas supply pipe 330. A flow rate of the $NH_3$ gas supplied into the gas supply pipe 330 is adjusted by the MFC 332. The $NH_3$ gas whose flow rate is adjusted is then supplied into the process chamber 201c through the plurality of the gas supply holes 430a of the nozzle 430, and is exhausted through the exhaust pipe 231. Thereby, the $NH_3$ gas is supplied to the plurality of the wafers including the wafer 200. In parallel with the supply of the $NH_3$ gas, the valve 534 is opened to supply the inert gas such as the $N_2$ gas into the gas supply pipe 530. A flow rate of the $N_2$ gas supplied into the gas supply pipe 530 is adjusted by the MFC 532. The $N_2$ gas whose flow rate is adjusted is then supplied into the process chamber 201c together with the $NH_3$ gas, and is exhausted through the exhaust pipe 231. In the step S21, in order to prevent the $NH_3$ gas from entering the nozzle 420, the valve 524 may be opened to supply the $N_2$ gas into the gas supply pipe 520. The $N_2$ gas is supplied into the process chamber 201c through the gas supply pipe 320 and the nozzle 420, and is exhausted through the exhaust pipe 231.

In the step S21, the APC valve 243 is appropriately adjusted (controlled) to adjust the inner pressure of the process chamber 201c to a pressure ranging from 100 Pa to 2,000 Pa. For example, the inner pressure of the process chamber 201c is adjusted to 800 Pa. A supply flow rate of the $NH_3$ gas controlled by the MFC 332 may be set to a flow rate ranging from 0.5 slm to 5 slm. A supply flow rate of the $N_2$ gas controlled by each of the MFCs 522 and 532 may be set to a flow rate ranging from 1 slm to 10 slm. The time duration of supplying the $NH_3$ gas to the wafer 200 may be set to a time ranging from 1 second to 300 seconds. In the step S21, the temperature of the heater 207 is set equal to the temperature of the heater 207 in the $SiCl_4$ gas supply (that is, the step S19).

Figure 11B:
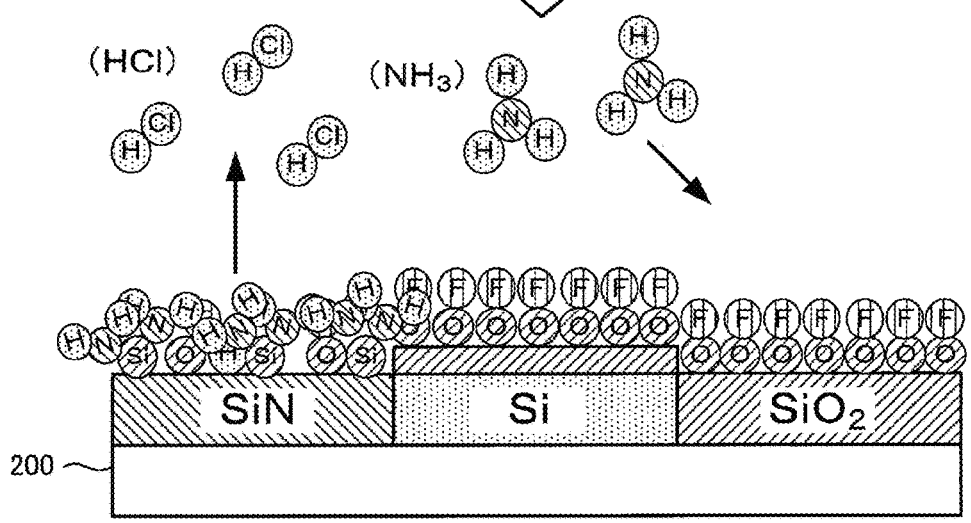
FIG. 11B is a model diagram schematically illustrating a state of the surface of the wafer immediately after $NH_3$ gas is supplied.

In the step S21, only the $NH_3$ gas and the $N_2$ gas are supplied into the process chamber 201c. As shown in FIG. 11B, a substitution reaction occurs between the $NH_3$ gas and at least a portion of the silicon-containing layer is formed on the SiN layer of the wafer 200 in the first step described above. During the substitution reaction, silicon (Si) contained in the silicon-containing layer and nitrogen (N) contained in the $NH_3$ gas are bonded. As a result, the silicon nitride film (SiN film) containing silicon and nitrogen is formed on the SiN layer of the wafer 200. That is, the $NH_3$ reacts with $SiCl_x$ to form a Si—N bond to form the SiN film. Then, the N—H bond serves as a new adsorption point for the $SiCl_4$ gas. The $NH_3$ cannot involve such reactions in locations where the $SiCl_x$ does not exist. That is, the SiN film is not formed on the oxide film of the wafer 200.

C-4: Fourth Step
Residual Gas Removing: Step S22

After the SiN film is formed on the SiN layer, the valve 334 is closed to stop the supply of the $NH_3$ gas. Then, a residual gas in the process chamber 201c such as the $NH_3$ gas which did not react or which contributed to the formation of the SiN film and reaction byproducts is removed from the process chamber 201c in the same manners as in the first step.

Performing a Predetermined Number of Times: Step S23

By performing a cycle wherein the step S19 through the step S22 described above are sequentially performed in that order one or more times (a predetermined number of times equal to n times) such that the $SiCl_4$ gas serving as the source gas and the $NH_3$ gas serving as the reactive gas are alternately supplied so as not to be mixed with each other, the SiN film of a predetermined thickness (for example, 0.1 nm to 10 nm) is formed on the SiN layer of the wafer 200. It is preferable that the cycle described above is repeatedly performed a plurality of times.

Performing a Predetermined Number of Times: Step S24

Figure 11C:
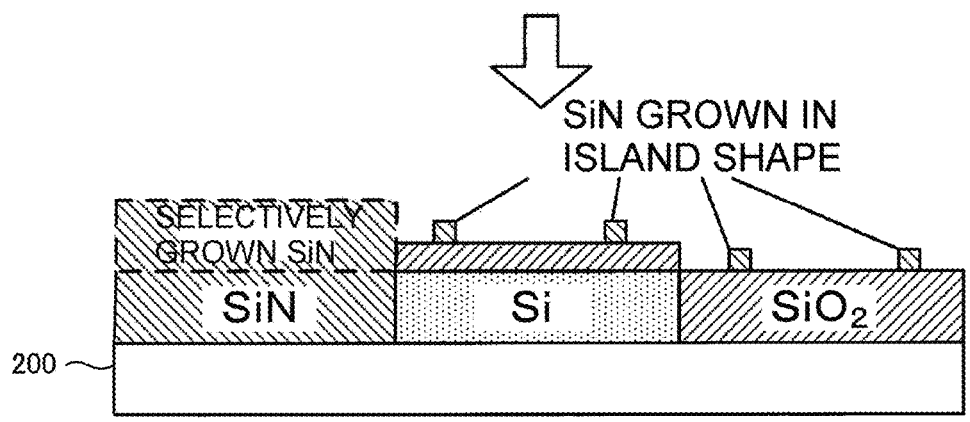
FIG. 11C is a model diagram schematically illustrating a state of the surface of the wafer immediately after a film-forming process is performed.

By performing a cycle wherein the step S16 through the step S23 described above are sequentially performed in order one or more times (a predetermined number of times equal to o times), the SiN film (selectively grown SiN film) of a predetermined thickness (for example, 1 nm to 100 nm) is formed on the SiN layer of the wafer 200. In the step S24, as shown in FIG. 11C, the SiN film is slightly formed (grown) like an island on the $SiO_2$ layer and the $SiO_2$ film on the Si layer due to imperfections.

D. Etching Process: Etching Step

Figure 12A:
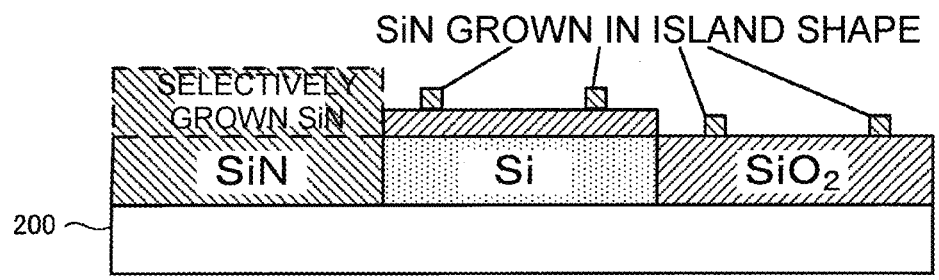
FIG. 12A is a model diagram schematically illustrating a state of the surface of the wafer with the Si layer, the $SiO_2$ layer and the SiN layer formed on the surface thereof before an etching process is performed.

Subsequently, as shown in FIG. 12A, the wafer 200 on which the SiN film is slightly formed is loaded into the process furnace 202d serving as the fourth processing structure, and the process of etching the slightly formed SiN film is performed. As described above, the SiN film is slightly formed (grown) on the portion of the wafer surface other than the SiN layer of the wafer 200. That is, the SiN film is slightly formed on the $SiO_2$ layer and the $SiO_2$ film on the Si layer of the wafer 200.

After an inner pressure and an inner temperature of the process furnace 202d are adjusted to a desired pressure and a desired temperature distribution, the etching process is performed. In the etching step, steps of the etching process different from those of the modifying process performed in the process furnace 202b will be described in detail below, and the description of steps of the etching process the same as those of the modifying process performed in the process furnace 202b will be omitted.

D-1: Etching Gas Supply Step

Etching Gas Supply: Step S25

Figure 12B:
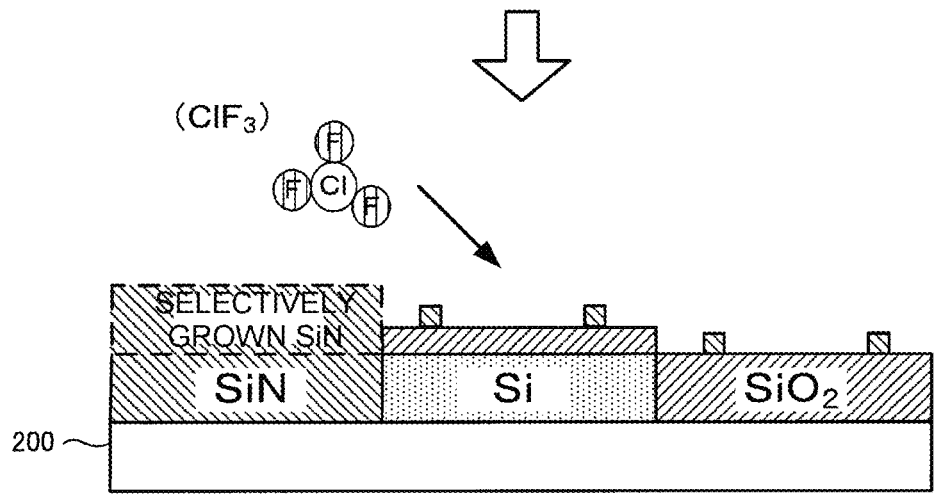
FIG. 12B is a model diagram schematically illustrating a state of the surface of the wafer immediately after the $ClF_3$ gas is supplied.

The valve 344 is opened to supply the $ClF_3$ gas serving as the etching gas into the gas supply pipe 340. A flow rate of the $ClF_3$ gas supplied into the gas supply pipe 340 is adjusted by the MFC 342. The $ClF_3$ gas whose flow rate is adjusted is then supplied into the process chamber 201d through the plurality of the gas supply holes 440a of the nozzle 440, and is exhausted through the exhaust pipe 231. Thereby, as shown in FIG. 12B, the $ClF_3$ gas is supplied to the plurality of the wafers including the wafer 200. In parallel with the supply of the $ClF_3$ gas, the valve 544 is opened to supply the inert gas such as the $N_2$ gas into the gas supply pipe 540. A flow rate of the $N_2$ gas supplied into the gas supply pipe 540 is adjusted by the MFC 542. The $N_2$ gas whose flow rate is adjusted is then supplied into the process chamber 201d together with the $ClF_3$ gas, and is exhausted through the exhaust pipe 231.

In the step S25, the APC valve 243 is appropriately adjusted (controlled) to adjust the inner pressure of the process chamber 201d to a pressure ranging from 1 Pa to 1,000 Pa. A supply flow rate of the $ClF_3$ gas controlled by the MFC 342 may be set to a flow rate ranging from 1 sccm to 1,000 sccm. A supply flow rate of the $N_2$ gas controlled by the MFC 542 may be set to a flow rate ranging from 100 sccm to 10,000 sccm. The time duration of supplying the $ClF_3$ gas to the wafer 200 may be set to a time ranging from 1 second to 3,600 seconds. In the step S25, the temperature of the heater 207 is set such that the temperature of the wafer 200 reaches and is maintained at a temperature ranging from 30° C. to 500° C., preferably from 30° C. to 450° C., and more preferably from 30° C. to 400° C.

After a predetermined time has elapsed from the supply of the $ClF_3$ gas, the valve 344 of the gas supply pipe 340 is closed to stop the supply of the $ClF_3$ gas. As a result, the SiN film slightly formed like an island on the oxide film is etched and removed.

D-2: Purge Step

Residual Gas Removing: Step S26

Figure 12C:
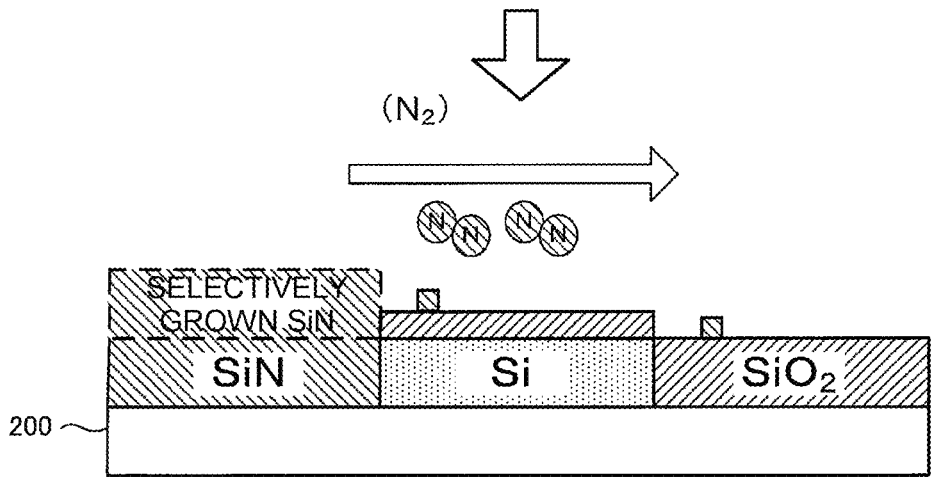
FIG. 12C is a model diagram schematically illustrating a state of the surface of the wafer immediately after the $N_2$ gas is supplied.

Subsequently, after the supply of the $ClF_3$ gas is stopped, a purge process (purge step) of exhausting the gas in the process chamber 201d is performed. In the step S26, with the APC valve 243 of the exhaust pipe 231 open, the vacuum pump 246 vacuum-exhausts an inner atmosphere of the process chamber 201d to remove a residual gas in the process chamber 201d such as the $ClF_3$ gas which did not react and the $ClF_3$ gas after etching the SiN film slightly formed on a portion of the wafer surface other than the SiN layer of the wafer 200. In the step S26, with the valve 544 open, the $N_2$ gas is continuously supplied into the process chamber 201d. As shown in FIG. 12C, the $N_2$ gas serves as a purge gas, which improves the efficiency of removing the residual gas in the process chamber 201d such as the $ClF_3$ gas which did not react, the $ClF_3$ gas after etching the SiN film slightly formed on a portion of the wafer surface other than the SiN layer of the wafer 200 and byproducts generated by the etching from the process chamber 201d.

Performing a Predetermined Number of Times: Step S27

By performing a cycle wherein the step S25 and the step S26 described above are sequentially performed in order one or more times (a predetermined number of times, p times), the SiN film slightly formed on a portion of the wafer surface other than the SiN layer of the wafer 200 is light-etched.

Performing a Predetermined Number of Times: Step S28

Figure 12D:
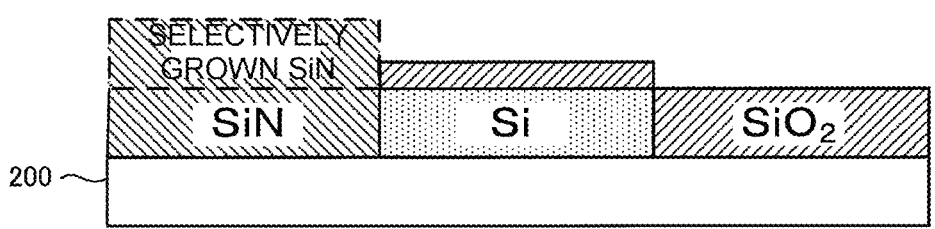
FIG. 12D is a model diagram schematically illustrating a state of the surface of the wafer after a substrate processing according to the embodiment of the present disclosure is performed.

By performing a cycle wherein the step S16 through the step S27 described above are sequentially performed in order one or more times (a predetermined number of times, q times), as shown in FIG. 12D, the SiN film is selectively grown on the surface of the SiN layer of the wafer 200 wherein the Si layer, the $SiO_2$ layer and the SiN layer are formed on the surface thereof while suppressing damage to the surface of the Si layer of the wafer 200.

(3) Effects According to Present Embodiment

According to careful studies, the disclosers discovered a method of preferentially forming (selectively growing) the SiN film or a titanium nitride film (TiN film) on the SiN layer of the wafer wherein the Si layer, the $SiO_2$ layer and the SiN layer are formed on the surface thereof. That is, by exposing the adsorption control agent such as the $ClF_3$ gas before the film-forming process is performed and by appropriately controlling the temperature, the pressure and the time when exposing the adsorption control agent to adsorb the fluorine molecules on the Si layer and the $SiO_2$ layer, the SiN film or the TiN film is likely to selectively grow on the SiN layer, and is difficult to selectively grow on the Si layer and the $SiO_2$ layer. However, when the adsorption control agent containing fluorine is exposed, the surface of the Si layer may be damaged such as being etched by the fluorine molecules.

According to the present embodiment, by performing the DHF cleaning and supplying the halide to the wafer wherein at least the Si layer and the SiN layer are formed on the surface thereof before exposing the wafer to the adsorption control agent containing fluorine, the natural oxide film on the surface of the wafer is removed. Then, after the natural oxide film is removed and before the wafer is exposed to the adsorption control agent, by performing the APM cleaning to the surface of the wafer, the oxide film is formed on the surface of the Si layer, whereas the oxide film is hardly formed on the surface of the SiN layer. In other words, the oxide film is re-formed on the surface of the Si layer.

The oxide film re-formed on the surface of the Si layer functions as the protective film for the Si layer. Thus, it is possible to suppress damage such as the etching of the Si layer by the fluorine components contained in the $ClF_3$ gas serving as the adsorption control agent exposed in the subsequent modifying process.

Since the halogen (fluorine molecules) is adsorbed on the oxide film, the halogen (chlorine molecules) contained in the $SiCl_4$ gas serving as the source gas and the fluorine molecules on the oxide film are electrically negative ligands, which serve as a repulsive factor. Thus, the source gas is not adsorbed on the oxide film with the fluorine molecules adsorbed on the surface thereof. In addition, since the heat resistance of the surface modified by the inorganic substance is high, even when the film is formed by the film-forming process at the high film-forming temperature of 500° C. or higher, the SiN film can be selectively grown on the surface of the SiN layer without disengaging the adsorption of the fluorine molecules on the oxide film.

That is, according to the present embodiment, it is possible to selectively form a thin film on the substrate while suppressing damage to other films of the substrate on which the thin film is not formed.

(4) Experimental Examples

First Experimental Example

Figure 13B:
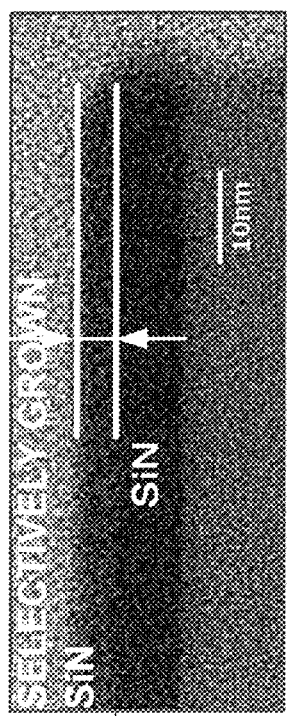
FIG. 13B is an enlarged view schematically illustrating a surface state of the SiN layer shown in FIG. 13A.
Figure 13C:
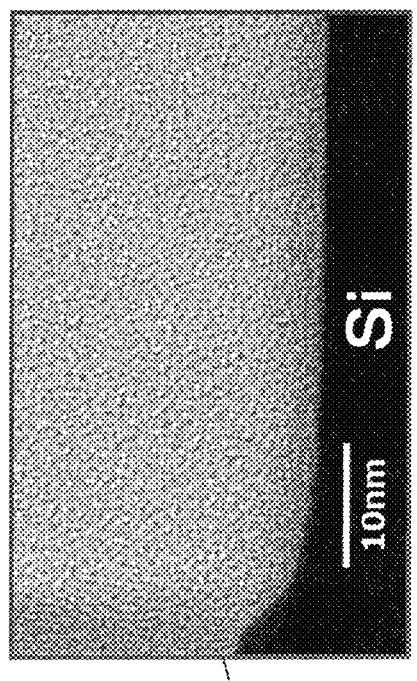
FIG. 13C is an enlarged view schematically illustrating a surface state of the Si layer shown in FIG. 13A.
Figure 13A:
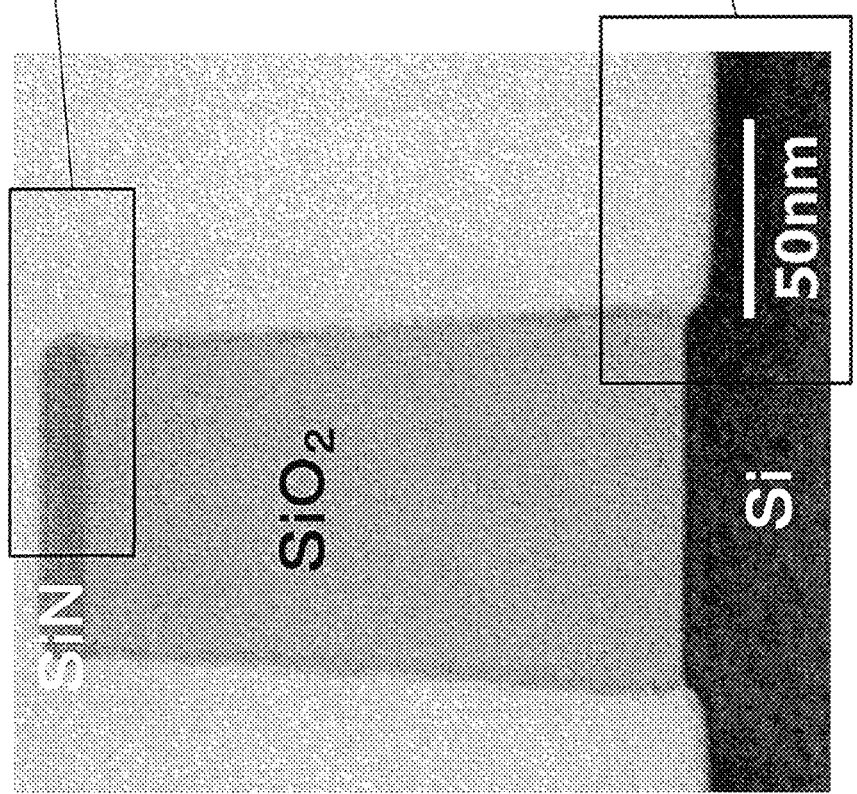
FIG. 13A schematically illustrates a vertical cross-section of the wafer with the Si layer, the SiO$_2$ layer and the SiN layer formed on the surface thereof when a silicon nitride film (SiN film) is selectively grown by the substrate processing apparatus 10 and the substrate processing according to the embodiment of the present disclosure.

FIGS. 13A through 13C schematically illustrate vertical cross-sections of the wafer with the Si layer, the $SiO_2$ layer and the SiN layer formed on the surface thereof when the SiN film is selectively grown on the SiN layer by performing the substrate processing to the wafer using the substrate processing apparatus 10 described above. According to the first experimental example, the APM cleaning in the step S13 of the substrate processing is performed at 70° C.

As shown in FIG. 13B, it is confirmed that the SiN film of a size of about 5 nm is selectively grown on the SiN layer. In addition, as shown in FIG. 13C, it is confirmed that there is no damage due to the etching on the Si layer and that the adhesion of the SiN film is negligible.

Second Experimental Example

Figure 14A:
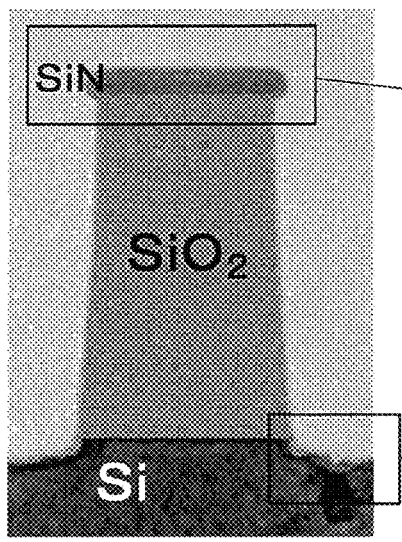
FIG. 14A schematically illustrates a vertical cross-section of the wafer with the Si layer, the SiO$_2$ layer and the SiN layer formed on the surface thereof without performing an APM cleaning of the substrate processing according to the embodiment of the present disclosure.
Figure 14B:
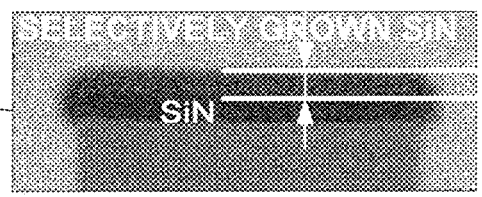
FIG. 14B is an enlarged view schematically illustrating a surface state of the SiN layer shown in FIG. 14A.
Figure 14C:
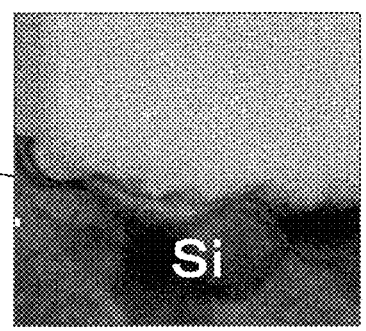
FIG. 14C is an enlarged view schematically illustrating a surface state of the Si layer shown in FIG. 14A, FIG. 14D schematically illustrates a vertical cross-section of the wafer with the Si layer, the SiO$_2$ layer and the SiN layer formed on the surface thereof without performing a DHF cleaning of the substrate processing according to the embodiment of the present disclosure.

FIGS. 14A through 14C schematically illustrate vertical cross-sections of the wafer with the Si layer, the $SiO_2$ layer and the SiN layer formed on the surface thereof when the SiN film is selectively grown on the SiN layer by performing the substrate processing described above without performing the APM cleaning in the step S13 through the drying in the step S15 thereof to the wafer using the substrate processing apparatus 10 described above. That is, FIGS. 14A through 14C schematically illustrate the vertical cross-sections of the wafer when the SiN film is selectively grown on the SiN layer by performing the substrate processing wherein, after the DHF cleaning in the step S10 through the drying in the step S12 of the substrate processing are performed, the steps S16 through S18 of the modifying process are performed without re-forming the oxide layer on the surface of the Si layer by the chemical action.

As shown in FIG. 14B, it is confirmed that the SiN film is selectively grown on the SiN layer. However, as shown in FIG. 14C, it is confirmed that an upper portion of the Si layer is etched.

Third Experimental Example

Figure 14D:
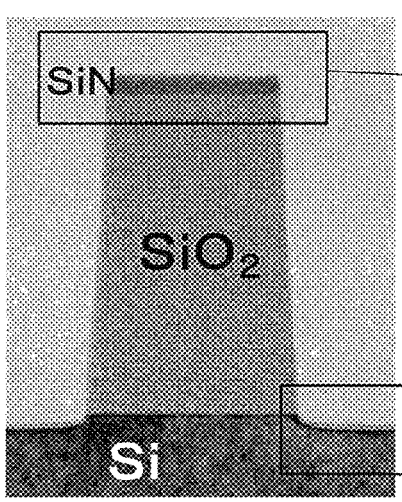
FIG. 14E is an enlarged view schematically illustrating a surface state of the SiN layer shown in FIG. 14D.
FIG. 14F is an enlarged view schematically illustrating a surface state of the Si layer shown in FIG. 14D.
Figure 14E:
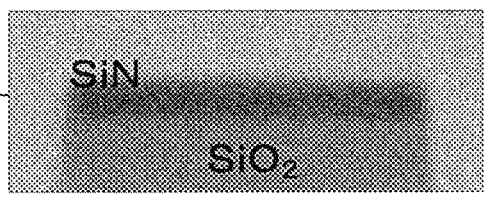
Figure 14F:
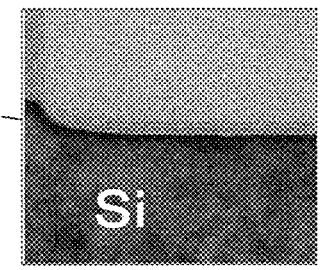

FIGS. 14D through 14F schematically illustrate vertical cross-sections of the wafer with the Si layer, the $SiO_2$ layer and the SiN layer formed on the surface thereof when the SiN film is selectively grown on the SiN layer by performing the substrate processing described above without performing the DHF cleaning in the step S10 through the drying in the step S12 thereof to the wafer using the substrate processing apparatus 10 described above. That is, FIGS. 14D through 14F schematically illustrate the vertical cross-sections of the wafer when the SiN film is selectively grown on the SiN layer by performing the substrate processing wherein the APM cleaning in the step S13 through the drying in the step S15 are performed without removing the natural oxide film and the steps S16 through S18 of the modifying process are performed.

As shown in FIGS. 14E and 14F, it is confirmed that the SiN film is not selectively grown on either the SiN layer or the Si layer. In addition, as shown in FIG. 14F, it is confirmed that the Si layer is not etched. That is, since the natural oxide film remains on the Si layer, the etching of the Si layer can be prevented. However, the SiN film is not selectively grown on the SiN layer. It is thought that the film-forming is suppressed on the Si layer since the surface of the SiN layer is oxidized by an ashing process during a pattern processing.

That is, it is confirmed that the DHF cleaning is effective when the SiN film is preferentially and selectively grown on the SiN layer, but the etching on the Si layer is promoted. However, it is confirmed that the etching is suppressed by performing the APM cleaning after the DHF cleaning.

Fourth Experimental Example

Subsequently, referring to FIG. 15A, descriptions will be presented as to differences in the thickness of the SiN film, which is formed using the substrate processing apparatus 10 described above, between the cases of a first comparative example, a second comparative example, a third comparative example and an example according to the present embodiment. In the first comparative example, the SiN film is selectively grown on the SiN layer according to the substrate processing without performing the DHF cleaning and APM cleaning described above on the surface of the SiN layer immediately after the formation of the SiN layer. In the second comparative example, the SiN film is selectively grown on the SiN layer according to the substrate processing without performing the DHF cleaning and APM cleaning on the surface of the SiN layer after a predetermined time has elapsed since the formation of the SiN layer. In the third comparative example, the SiN film is selectively grown on the SiN layer according to the substrate processing with performing the DHF cleaning on the surface of the SiN layer (without performing the APM cleaning) after the predetermined time has elapsed since the formation of the SiN layer. In the example according to the present embodiment, the SiN film is selectively grown on the SiN layer according to the substrate processing on the surface of the SiN layer (with performing the DHF cleaning and the APM cleaning).

Figure 15A:
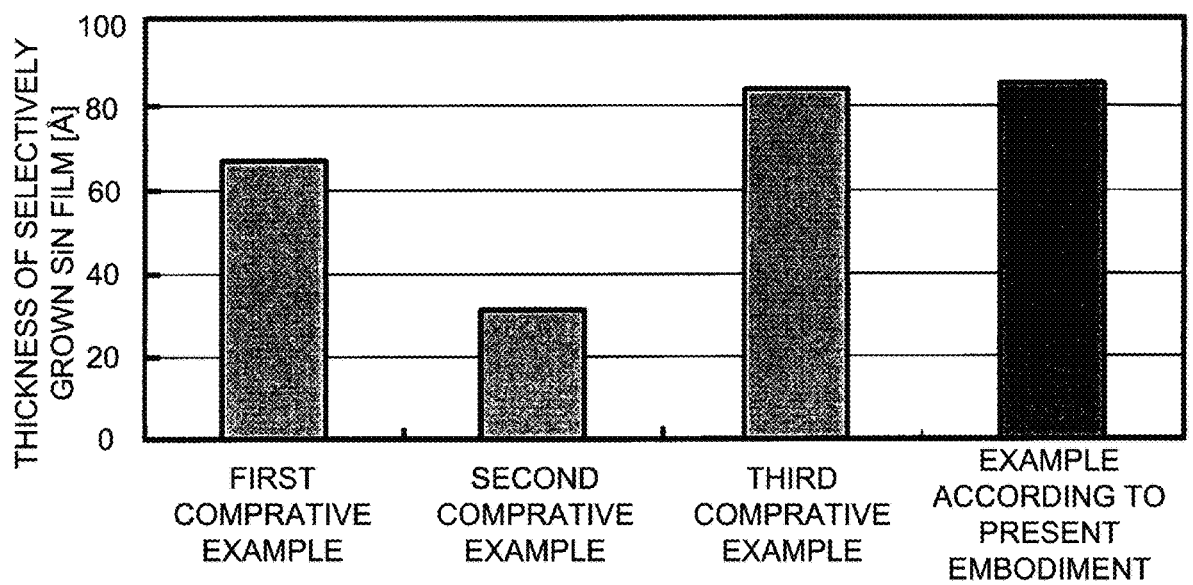
FIG. 15A schematically illustrates a relationship among the DHF cleaning, the APM cleaning and a thickness of the SiN film selectively formed when a base film is the SiN layer, and FIG. 15B schematically illustrates a relationship among the DHF cleaning, the APM cleaning and a thickness of the SiN film selectively formed when the base film is the Si layer.

As shown in the first comparative example and the second comparative example of FIG. 15A, it is confirmed that the thickness of the SiN film selectively grown is thin when the predetermined time has elapsed after the formation of the SiN layer as compared with a case where the SiN film is selectively grown immediately after the formation of the SiN layer. It is thought that, since the natural oxide film is formed on the SiN layer as the predetermined time has elapsed after the formation of the SiN layer, the natural oxide film makes it difficult to selectively grow the SiN film. As shown in the second comparative example and the third comparative example of FIG. 15A, it is confirmed that, by performing the DHF cleaning, the thickness of the SiN film selectively grown increases even when the DHF cleaning is performed after the predetermined time has elapsed after the formation of the SiN layer. It is thought that, since the natural oxide film is removed by DHF cleaning, the thickness of the SiN film selectively grown increases. In addition, as shown in the first comparative example, it is confirmed that the SiN film is selectively grown on the SiN layer even when the DHF cleaning is not performed when the SiN film is formed immediately after the formation of the SiN layer. In addition, as shown in the third comparative example and the example according to the present embodiment, it is confirmed that the thickness of the SiN film selectively grown on the SiN layer is almost unchanged even when the APM cleaning is performed after the DHF cleaning. That is, it is thought that the oxidation state of the surface of the SiN layer, which is a base film, functions as an inhibitory factor when the SiN film is selectively grown, whereas the APM cleaning does not function as the inhibitory factor when the SiN film is selectively grown.

Fifth Experimental Example

Subsequently, referring to FIG. 15B, descriptions will be presented as to differences in the thickness of the SiN film, which is formed using the substrate processing apparatus 10 described above, between the cases of a fourth comparative example, a fifth comparative example and the example according to the present embodiment. In the fourth comparative example, the SiN film is selectively grown on the SiN layer according to the substrate processing without performing the DHF cleaning and APM cleaning described above. In the fifth comparative example, the SiN film is selectively grown on the SiN layer according to the substrate processing with performing the DHF cleaning on the surface of the SiN layer (without performing the APM cleaning). In the example according to the present embodiment, the SiN film is selectively grown on the SiN layer according to the substrate processing (with performing the DHF cleaning and the APM cleaning).

Figure 15B:
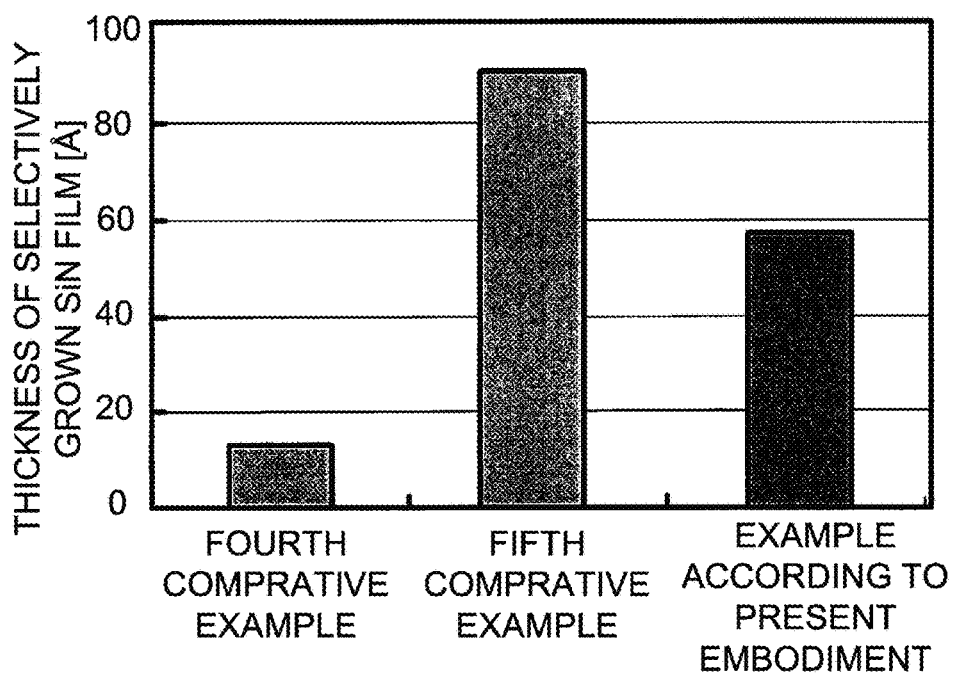

As shown in the fourth comparative example and the fifth comparative example of FIG. 15B, it is confirmed that the thickness of the SiN film selectively grown on the SiN layer is thin when the DHF cleaning is not performed. It is thought that, since the natural oxide film of about 1.5 nm is attached on the Si layer when the DHF cleaning is not performed, the natural oxide film inhibits the selective growth of the SiN film. On the other hand, by performing the DHF cleaning, the natural oxide film is removed, and the adsorption of the modifying gas capable of suppressing the subsequent adsorption of the source gas is reduced. That is, by removing the natural oxide film, the SiN film is formed on the Si layer, and the selective growth of the SiN film cannot be performed on the SiN layer. In addition, as shown in the example according to the present embodiment, even after the DHF cleaning is performed to remove the natural oxide film, by forming the oxide film on the Si layer by the chemical action by the APM cleaning, the selective growth of the SiN film is also suppressed as compared with the fifth comparative example in which only the DHF cleaning is performed.

That is, as shown in the substrate processing according to the present embodiment, it is confirmed that, by performing the APM cleaning after the DHF cleaning, the SiN film is selectively grown on the SiN layer and the selective growth of the SiN film is suppressed on the Si layer.

(5) Other Embodiments

Figure 16:
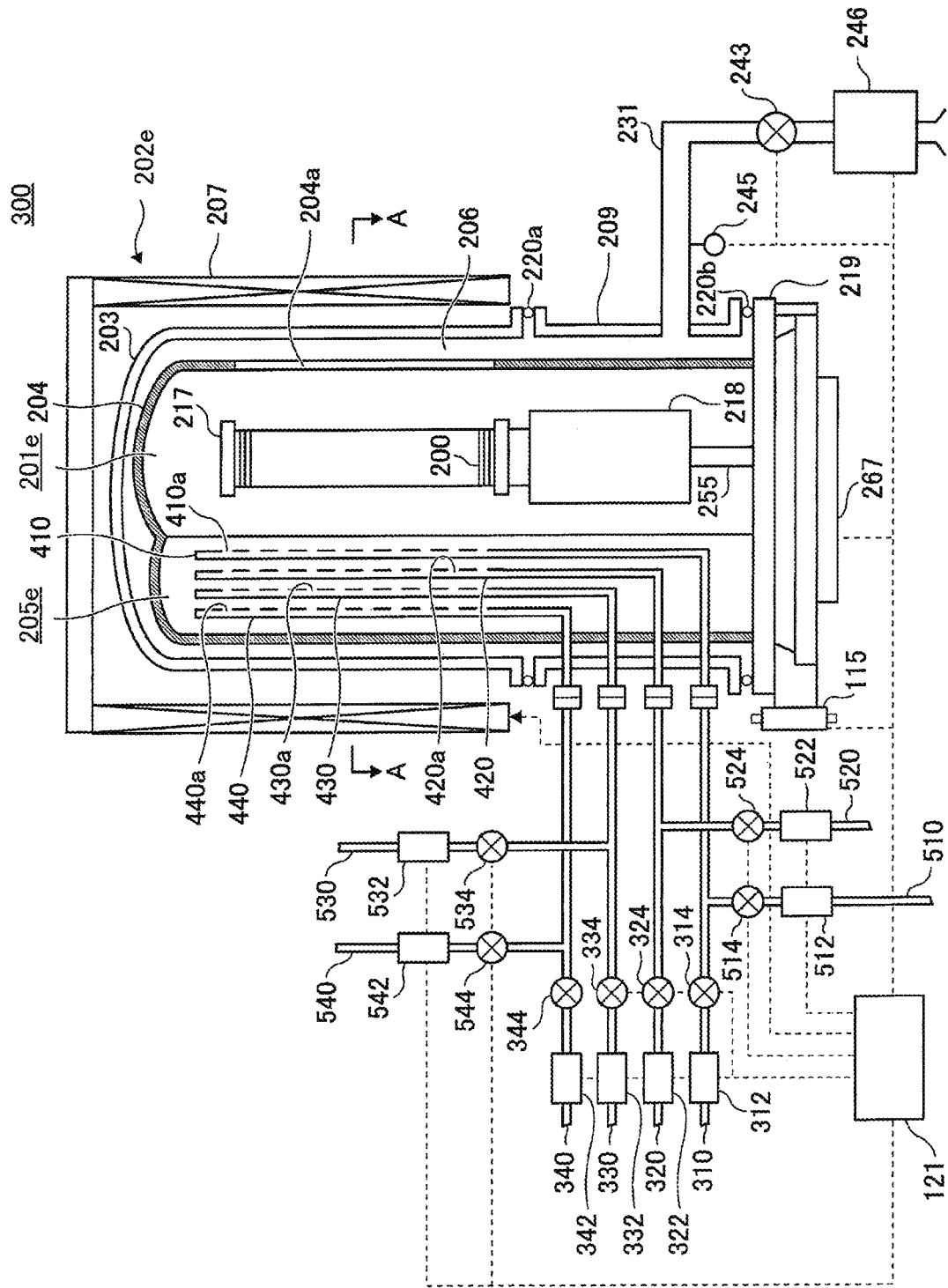
FIG. 16 schematically illustrates a vertical cross-section of a process furnace 202e of a substrate processing apparatus 300 according to another embodiment of the present disclosure.
Figure 17:
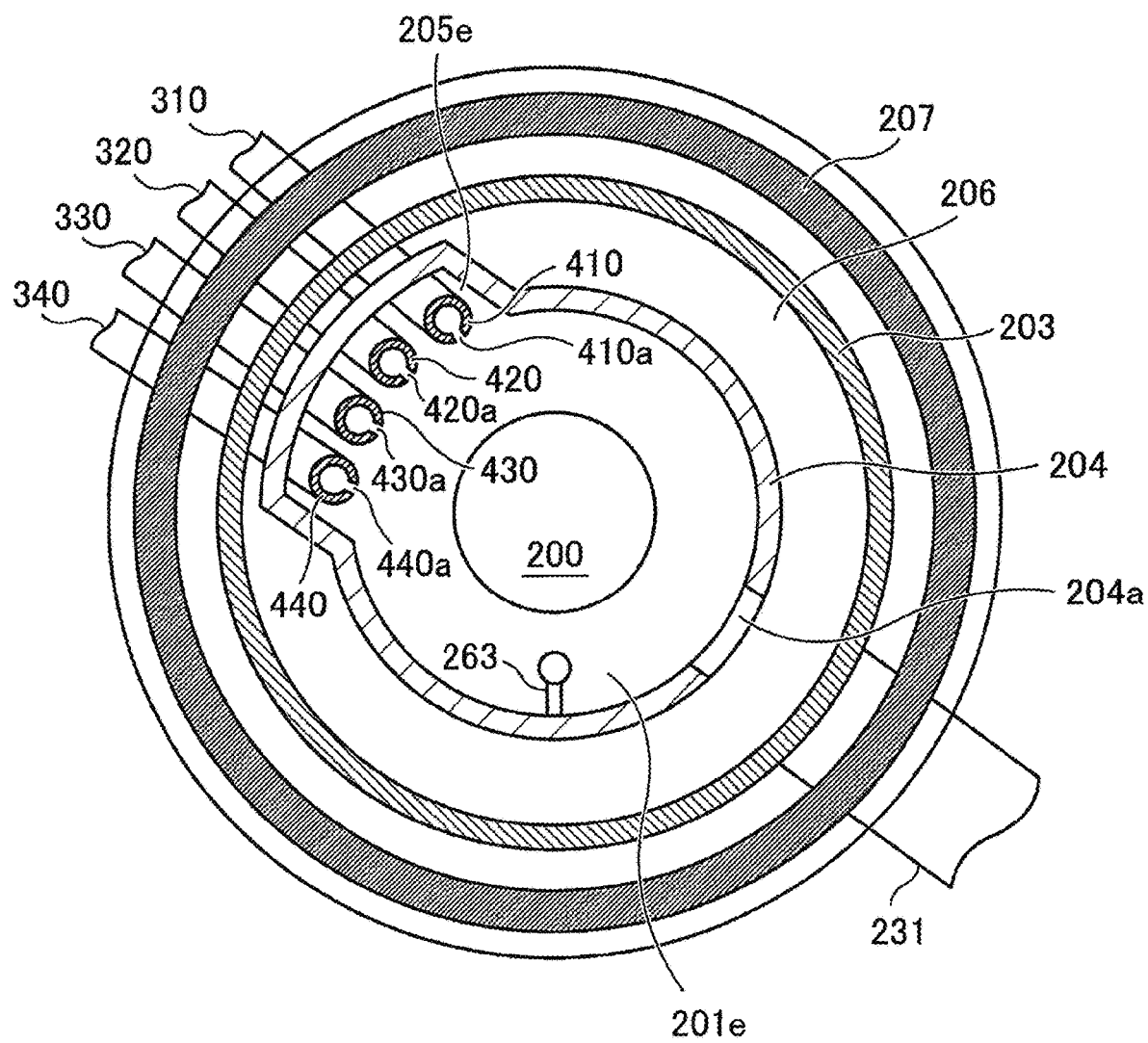
FIG. 17 is a top sectional view schematically illustrating the process furnace 202e shown in FIG. 16.

The above-described embodiment is described by way of an example in which the substrate processing apparatus 10 of a cluster type is used. As described above, the substrate processing apparatus 10 includes: the process furnace 202a in which the cleaning process is performed and including the first gas supply system and the second gas supply system; the process furnace 202b in which the modifying process is performed and including the third gas supply system; the process furnace 202c in which the film-forming process is performed and including the fourth gas supply system; and the process furnace 202d in which the etching process is performed and including the fifth gas supply system, and each process described above is performed in its corresponding process furnace. However, the above-described technique is not limited thereto. For example, the above-described technique may be similarly applied when a substrate processing apparatus including the process furnace 202a in which the cleaning process is performed and a substrate processing apparatus 300 shown in FIGS. 16 and 17 are used. For example, the substrate processing apparatus 300 includes a process furnace 202e (process chamber 201e) including the third gas supply system, the fourth gas supply system and the fifth gas supply system, and the modifying process, the film-forming process and the etching process are performed in the same process furnace 202e (process chamber 201e). That is, the above-described technique may be similarly applied a configuration in which the substrate processing is performed in-situ.

The above-described embodiment is described by way of an example in which the single wafer type process furnace is used as the process furnace 202a. However, the above-described technique is not limited thereto. For example, the above-described technique may be similarly applied when the batch type process furnace is used as the process furnace 202a.

The above-described embodiment is described by way of an example in which the batch type process furnace is used as each of the process furnace 202b, the process furnace 202c and the process furnace 202d. However, the above-described technique is not limited thereto. For example, the above-described technique may be similarly applied when the single wafer type process furnace is used as each of the process furnace 202b, the process furnace 202c and the process furnace 202d.

For example, the above-described technique may be similarly applied when a substrate processing apparatus including a process furnace in which the first gas supply system through the fifth gas supply system are provided and in which the processes described above are performed is used. In such a case, the first gas supply system and the second gas supply system are configured to perform the cleaning process using by a dry cleaning method using a gas instead of a wet cleaning method using the chemical solution and the rinse liquid described above.

The above-described embodiment is described by way of an example in which the DHF is used as a gas for removing the natural oxide film. However, the above-described technique is not limited thereto. For example, the above-described technique may be similarly applied when other chemical solutions such as hydrogen fluoride (hydrofluoric acid, hydrofluoric acid and HF) and isopropyl ether (IPE) are used as the gas for removing the natural oxide film. In addition, a mixed solution obtained by mixing water ($H_2O$), alcohol, ammonium fluoride ($NH_4F$) or the like with the at least one of the chemical solutions described above may be used as the gas for removing the natural oxide film.

The above-described embodiment is described by way of an example in which the mixed solution (SC1 solution) of the ammonia ($NH_3$) and the hydrogen peroxide solution ($H_2O_2$) is used as the oxidizing agent. However, the above-described technique is not limited thereto. For example, the above-described technique may be similarly applied when at least one among the ammonia, the hydrogen peroxide solution, a hydrogen peroxide gas (HCA: Hyper Cure Anneal), a mixed gas of an active species of oxygen and an active species of hydrogen and oxygen gas are used as the oxidizing agent.

The above-described embodiment is described by way of an example in which the $ClF_3$ gas is used as the modifying gas. However, the above-described technique is not limited thereto. For example, the above-described technique may be similarly applied when other gases such as tungsten hexafluoride ($WF_6$) gas, nitrogen trifluoride ($NF_3$) gas, hydrogen fluoride (HF) gas and fluorine ($F_2$) gas are used as the modifying gas.

The above-described embodiment is described by way of an example in which the $SiCl_4$ gas, which is a silicon source gas, is used as the source gas for the selective growth of the SiN film. However, the above-described technique is not limited thereto. For example, the above-described technique may be similarly applied when other gases such as titanium tetrachloride ($TiCl_4$) gas, aluminum tetrachloride ($AlCl_4$) gas, zirconium tetrachloride ($ZrCl_4$) gas, hafnium tetrachloride ($HfCl_4$) gas, tantalum pentachloride ($TaCl_5$) gas, tungsten pentoxide ($WCl_5$) gas, molybdenum pentoxide ($MoCl_5$) gas and tungsten hexachloride ($WCl_6$) gas are used as the source gas.

When the $ClF_3$ gas is used as the modifying gas, by using the silicon tetrachloride ($SiCl_4$) and the $NH_3$ gas serving as the source gas used for the selective growth, it is possible to selectively grow the SiN film at a high temperature of about 550° C. In addition, by using the titanium tetrachloride ($TiCl_4$) and the $NH_3$ gas as the source gas used for the selective growth, it is possible to selectively grow the TiN film at a low temperature of about 300° C.

The above-described embodiment is described by way of an example in which the $ClF_3$ gas is used as the etching gas. However, the above-described technique is not limited thereto. For example, the above-described technique may be similarly applied when other gases such as $NF_3$ gas, $CF_4$ gas, $CHF_3$ gas, $CH_2F$ gas, ClF gas, $F_2$ gas and HF gas are used as the etching gas.

The above-described embodiment is described by way of an example in which the modifying process and the etching process are performed in different process furnaces. However, the above-described technique is not limited thereto. For example, the modifying process and the etching process may be performed in the same process furnace, or the etching process may also serve as the modifying process. In such a case, each process may be performed under the respective process conditions, such as setting the temperature in the modifying process to about 100° C. and the temperature in the etching process to about 150° C.

The above-described technique is described based on the embodiments described above. However, the above-described technique is not limited thereto. For example, the above-described embodiments may be appropriately combined.

According to some embodiments in the present disclosure, it is possible to selectively form a thin film on a substrate while suppressing damage to other films of the substrate on which the thin film is not formed.

What is claimed is:

1. A substrate processing method, comprising:
   (a) providing a substrate where a natural oxide film is removed from a surface thereof by supplying a first inorganic material to the substrate wherein at least a first film containing silicon and a second film different from the first film are exposed on the surface of the substrate;
   (b) forming an oxide film on a surface of the first film by supplying an oxidizing agent to the substrate;
   (c) modifying the oxide film formed on the surface of the first film by supplying a second inorganic material to the substrate; and
   (d) after sequentially performing (a), (b) and (c), selectively growing a film on a surface of the second film by supplying a deposition gas to the substrate.

2. The method of claim 1, wherein the first inorganic material comprises a first halogen-based material containing a halogen element.

3. The method of claim 2, wherein the first halogen-based material comprises hydrogen fluoride.

4. The method of claim 1, wherein the oxidizing agent comprises at least one among ammonia, hydrogen peroxide solution, hydrogen peroxide gas, a mixed gas of an active species of oxygen and an active species of hydrogen and oxygen gas.

5. The method of claim 1, wherein the oxidizing agent comprises a mixed solution of ammonia and hydrogen peroxide solution.

6. The method of claim 1, wherein the second inorganic material comprises a second halogen-based material.

7. The method of claim 6, wherein the second halogen-based material comprises a fluorine-containing gas.

8. The method of claim 7, wherein the deposition gas comprises a source gas and a reactive gas reacting with the source gas, and
   wherein the source gas and the reactive gas are alternately supplied so as not to be mixed with each other in (d).

9. The method of claim 1, wherein the deposition gas comprises a source gas and a reactive gas reacting with the source gas, and
   wherein the source gas and the reactive gas are alternately supplied so as not to be mixed with each other in (d).

10. The method of claim 9, wherein the source gas comprises a third halogen-based material.

11. The method of claim 9, wherein the source gas comprises a chlorine-containing gas.

12. The method of claim 1, wherein the first film comprises a silicon film.

13. The method of claim 1, wherein the second film comprises a silicon nitride film.

14. The method of claim 1, wherein the film comprises a nitride film.

15. The method of claim 1, further comprising
(e) etching the film slightly formed on a portion of the surface of the substrate other than the surface of the second film by supplying an etching gas to the substrate after (d).

16. The method of claim 15, wherein (c), (d) and (e) are sequentially performed a plurality of times.

17. The method of claim 1, wherein a third film different from both of the first film and the second film is exposed on the surface of the substrate, and
wherein in (c), the surface of the first film and a surface of the third film are modified.

18. The method of claim 17, wherein the first film comprises a silicon film, and
wherein the third film comprises a silicon oxide film.

19. The method of claim 17, wherein in (d), the film is firstly deposited on the surface of the second film compared to the surface of the first film and the surface of the third film.

20. A substrate processing apparatus comprising:
a first gas supply system configured to supply a first inorganic material to a substrate wherein at least a first film containing silicon and a second film different from the first film are exposed on a surface of the substrate;
a second gas supply system configured to supply an oxidizing agent to the substrate;
a third gas supply system configured to supply a second inorganic material to the substrate;
a fourth gas supply system configured to supply a deposition gas to the substrate; and
a controller capable of controlling the first gas supply system, the second gas supply system, the third gas supply system and the fourth gas supply system to perform:
(a) providing a substrate where a natural oxide film is removed from the surface thereof by supplying the first inorganic material to the substrate;
(b) forming an oxide film on a surface of the first film by supplying the oxidizing agent to the substrate;
(c) modifying the oxide film formed on the surface of the first film by supplying the second inorganic material to the substrate; and
(d) after sequentially performing (a), (b) and (c), selectively growing a film on a surface of the second film by supplying the deposition gas to the substrate.

21. A non-transitory computer-readable recording medium storing a program that causes, by a computer, a substrate processing apparatus to perform:
(a) providing a substrate where a natural oxide film is removed from a surface thereof by supplying a first inorganic material to the substrate wherein at least a first film containing silicon and a second film different from the first film are exposed on the surface of the substrate;
(b) forming an oxide film on a surface of the first film by supplying an oxidizing agent to the substrate;
(c) modifying the oxide film formed on the surface of the first film by supplying a second inorganic material to the substrate; and
(d) after sequentially performing (a), (b) and (c), selectively growing a film on a surface of the second film by supplying a deposition gas to the substrate.

22. A method of manufacturing a semiconductor device, comprising the method of claim 1.

* * * * *